US012546002B2

(12) United States Patent
Kasamatsu et al.

(10) Patent No.: US 12,546,002 B2
(45) Date of Patent: Feb. 10, 2026

(54) REACTION TUBE, SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Kenta Kasamatsu, Toyama (JP); Atsushi Hirano, Toyama (JP); Tetsuo Yamamoto, Toyama (JP); Takafumi Sasaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 765 days.

(21) Appl. No.: 17/694,134

(22) Filed: Mar. 14, 2022

(65) Prior Publication Data
US 2022/0307137 A1   Sep. 29, 2022

(30) Foreign Application Priority Data

Mar. 26, 2021   (JP) .................................. 2021-053975

(51) Int. Cl.
*C23C 16/455*   (2006.01)
*C23C 16/44*   (2006.01)
*H01L 21/67*   (2006.01)

(52) U.S. Cl.
CPC .... *C23C 16/45561* (2013.01); *C23C 16/4412* (2013.01); *C23C 16/45502* (2013.01); *C23C 16/45587* (2013.01); *H01L 21/67017* (2013.01)

(58) Field of Classification Search
None
See application file for complete search history.

(56) References Cited

U.S. PATENT DOCUMENTS 5,902,103 A * 5/1999 Maeda ............... C23C 16/45591
432/152
10,934,618 B2 * 3/2021 Nagata ............... H01L 21/67757
(Continued)

FOREIGN PATENT DOCUMENTS

| CN | 105990197 A | 10/2016 |
| JP | 07-78771 A | 3/1995 |

(Continued)

OTHER PUBLICATIONS

Korean Office Action issued on Apr. 29, 2024 for Korean Patent Application No. 10-2022-0030569.
(Continued)

*Primary Examiner* — Jeffrie R Lund
*Assistant Examiner* — Tiffany Z Nuckols
(74) *Attorney, Agent, or Firm* — Volpe Koenig

(57) ABSTRACT

There is provided a technique capable of uniformizing a flow of a gas discharged from a discharger by reducing a pressure difference in a substrate arrangement region of a process chamber. According to one aspect of the technique, there is provided a reaction tube in which a process chamber is provided and including an adjusting structure configured to suppress a flow of a gas discharged from a discharger, wherein a gas supplier is provided at one end of the process chamber and the discharger is provided at the other end of the process chamber, and a flow of the gas from the gas supplier to the discharger in the process chamber is adjusted by the adjusting structure such that the flow of the gas discharged from the discharger is uniformized.

19 Claims, 23 Drawing Sheets

(56) References Cited

U.S. PATENT DOCUMENTS

| | | |
|---|---|---|
| 2010/0154711 A1 | 6/2010 | Ishibashi et al. |
| 2012/0186573 A1 | 7/2012 | Jdira et al. |
| 2014/0345801 A1* | 11/2014 | Yang ................ H01L 21/67757 |
| | | 118/712 |
| 2016/0276206 A1 | 9/2016 | Kaneko et al. |
| 2018/0076021 A1* | 3/2018 | Fukushima ....... H01L 21/67109 |
| 2018/0135176 A1 | 5/2018 | Morikawa et al. |
| 2020/0048768 A1 | 2/2020 | Wiegers |

FOREIGN PATENT DOCUMENTS

| | | |
|---|---|---|
| JP | 10-032170 A | 2/1998 |
| JP | 2010258265 A | 11/2010 |
| JP | 2012-156510 A | 8/2012 |
| JP | 2016-178136 A | 10/2016 |
| JP | 2018170468 A | 11/2018 |
| JP | 2020-027941 A | 2/2020 |
| KR | 1020160112948 A | 9/2016 |
| TW | 201104748 A | 2/2011 |
| WO | 2004027846 A1 | 4/2004 |
| WO | 2017/010125 A1 | 1/2017 |
| WO | 2019038974 A1 | 2/2019 |

OTHER PUBLICATIONS

Singapore Office Action issued on Jul. 17, 2023 for Singapore Patent Application No. 10202202533T.
Taiwan Office Action issued on Jan. 2, 2023 for Taiwan Patent Application No. 110149648.
Japanese Office Action issued on Feb. 14, 2023 for Japanese Patent Application No. 2021-053975.
Chinese Office Action issued on Sep. 24, 2024 for Chinese Patent Application No. 202210273408.0.

* cited by examiner

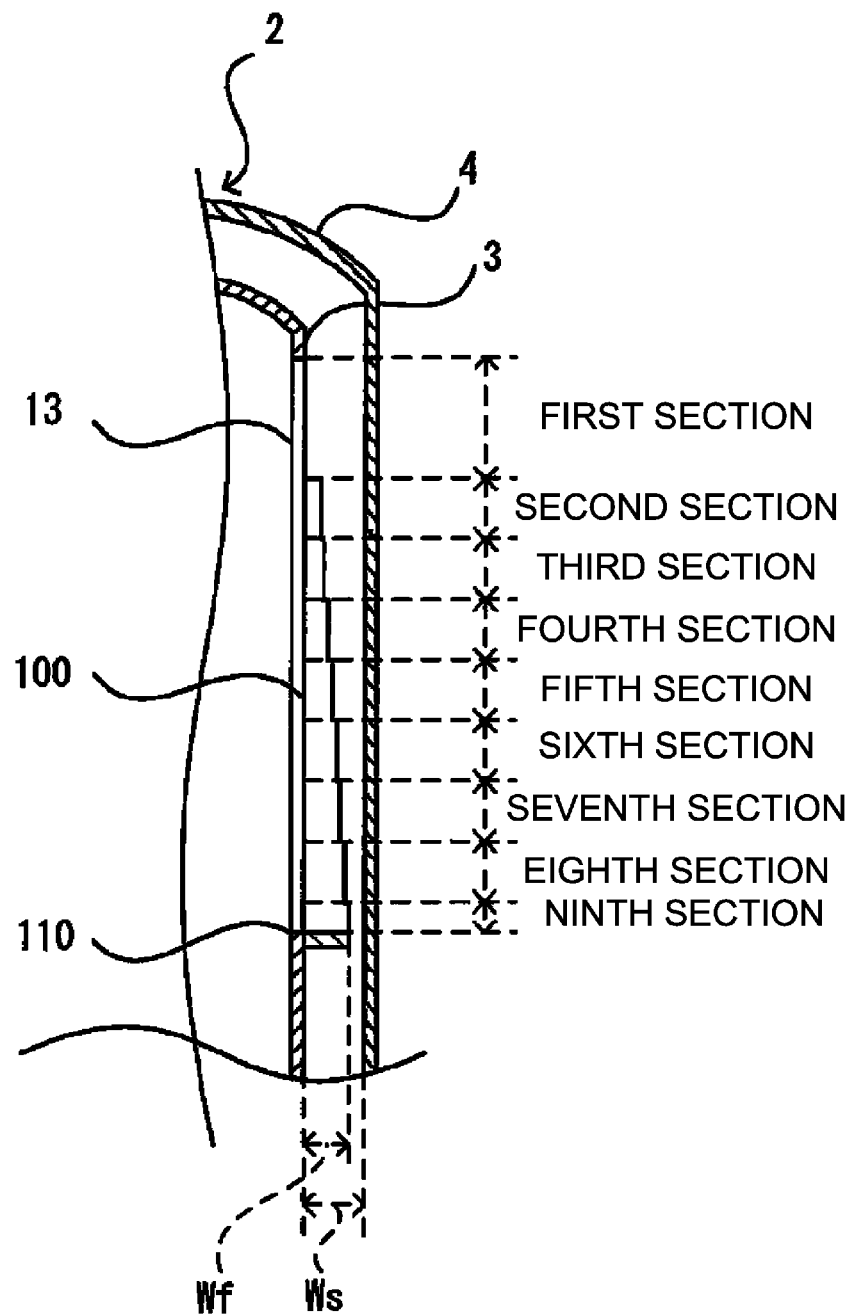

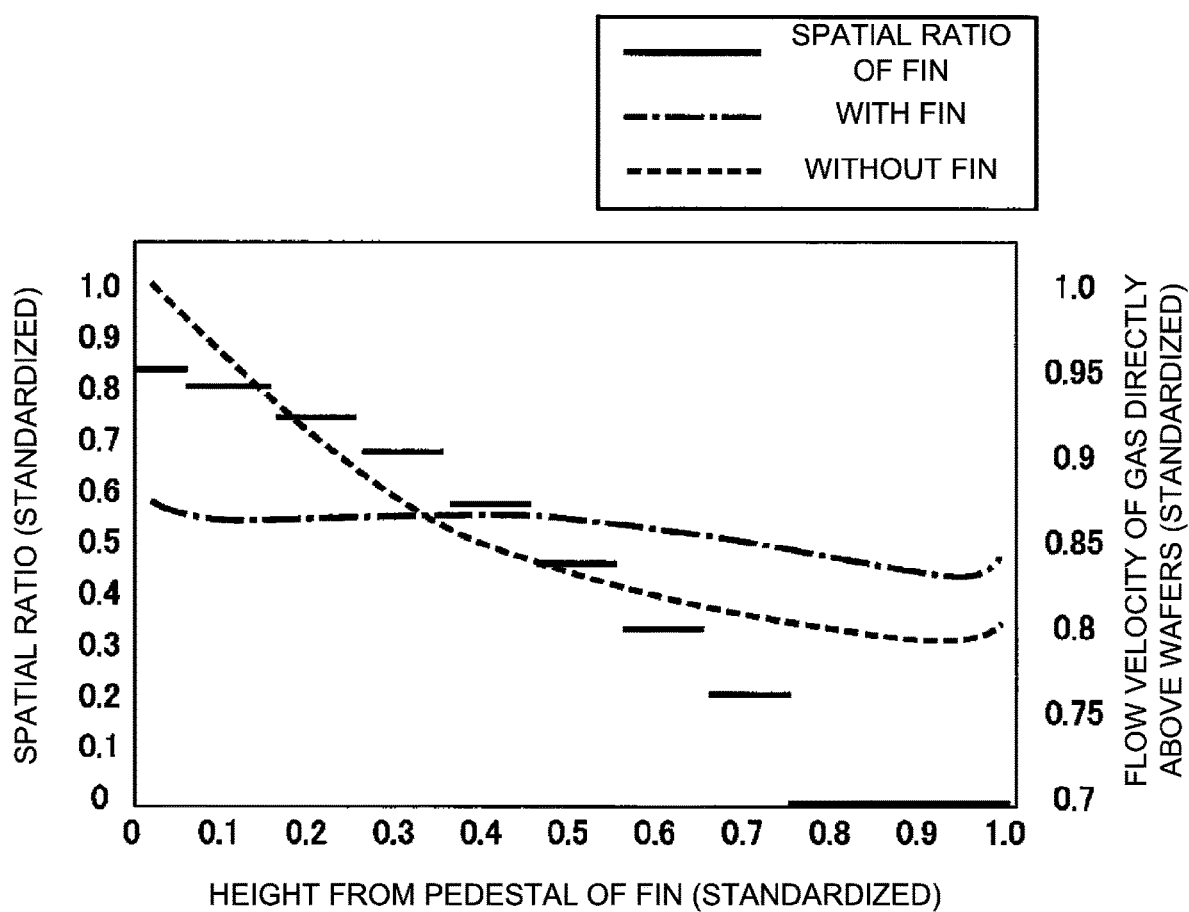

REACTION TUBE, SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2021-053975, filed on Mar. 26, 2021, in the Japanese Patent Office, the entire contents of which are hereby incorporated by reference.

BACKGROUND

1. Field

The present disclosure relates to a reaction tube, a substrate processing apparatus and a method of manufacturing a semiconductor device.

2. Related Art

As a substrate processing apparatus configured to process a substrate, a substrate processing apparatus may be used. The substrate processing apparatus may include a reaction tube in which a process chamber is provided. For example, a predetermined number of substrates are arranged in the process chamber. For example, the substrate processing apparatus is configured to perform a substrate processing by heating the predetermined number of substrates to a predetermined temperature and supplying a process gas into the process chamber.

According to some related arts, a configuration for improving an exhaust efficiency of the process chamber is disclosed. More specifically, a gas supplier is provided at one end of the configuration and a discharger is provided at the other end of the configuration with a substrate arrangement region of the process chamber interposed therebetween.

For example, in a vertical type substrate processing apparatus in which the substrates are arranged in the vertical direction, when a pressure difference is generated in the substrate arrangement region of the process chamber, a film thickness uniformity between the substrates may deteriorate.

SUMMARY

According to the present disclosure, there is provided a technique capable of uniformizing a flow of a gas discharged from a discharger by reducing a pressure difference in a substrate arrangement region of a process chamber.

According to one aspect of the technique of the present disclosure, there is provided a reaction tube in which a process chamber is provided, including an adjusting structure configured to suppress a flow of a gas discharged from a discharger, wherein a gas supplier is provided at one end of the process chamber and the discharger is provided at the other end of the process chamber, and a flow of the gas from the gas supplier to the discharger in the process chamber is adjusted by the adjusting structure such that the flow of the gas discharged from the discharger is uniformized.

BRIEF DESCRIPTION OF THE DRAWINGS

FIG. 4 is an enlarged view schematically illustrating a fin and its periphery shown in FIG. 1.

FIG. 5A is a diagram schematically illustrating a flow of a gas in a process furnace of a conventional substrate processing apparatus and FIG. 5B is a diagram schematically illustrating the flow of the gas in the process furnace of the substrate processing apparatus preferably used in the embodiments of the present disclosure.

FIG. 6 is a diagram schematically illustrating a flow velocity of the gas in the process furnace of the substrate processing apparatus preferably used in the embodiments of the present disclosure.

DETAILED DESCRIPTION

Embodiments

Figure 1:
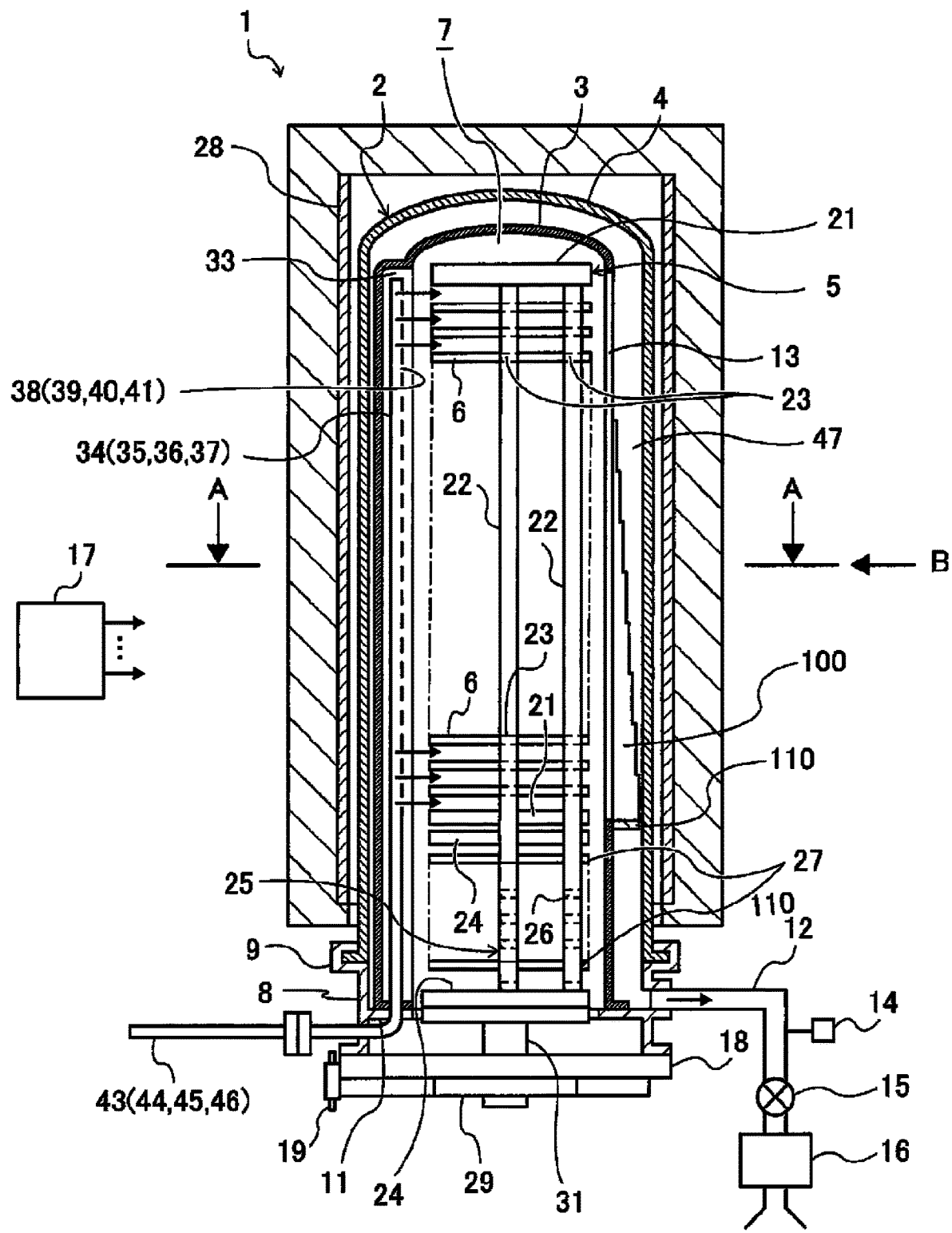
FIG. 1 is a diagram schematically illustrating a vertical cross-section of a process furnace of a substrate processing apparatus preferably used in one or more embodiments of the present disclosure.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

First, a substrate processing apparatus, which is an example of a semiconductor manufacturing apparatus used in a part of a manufacturing process of a semiconductor device, will be described. According to the embodiments of the present disclosure, as an example of the substrate processing apparatus, a batch type vertical substrate processing apparatus configured to perform a process such as a film-forming process to a plurality of substrates simultaneously will be described.

The substrate processing apparatus according to the present embodiments includes a process furnace 1. The process furnace 1 will be described with reference to FIGS. 1 and 2.

The process furnace 1 includes a vertical type process tube 2 serving as a reaction tube which is vertically arranged such that a center line thereof is vertical and which is fixedly supported by a housing (not shown). Hereinafter, the vertical type process tube 2 may also be simply referred to as a "process tube 2". The process tube 2 includes an inner tube 3 and an outer tube 4. Each of the inner tube 3 and the outer tube 4 is integrally formed as a single body. For example, each of the inner tube 3 and the outer tube 4 is made of a high heat resistant material such as quartz ($SiO_2$), silicon carbide (SiC), a composite material of the quartz and a composite material of the silicon carbide.

The inner tube 3 is of a cylindrical shape with a closed upper end and an open lower end, and a boat 5 serving as a substrate retainer (which is a substrate retaining structure) is accommodated in the inner tube 3. A plurality of wafers including a wafer 6 serving as a substrate are vertically arranged (stacked) in a horizontal orientation in a multistage manner by the boat 5. Hereinafter, the plurality of wafers including the wafer 6 may also be simply referred to as "wafers 6". A process chamber 7 in which the wafers 6 are accommodated and processed is defined by an inner space of the inner tube 3. A lower end opening of the inner tube 3 constitutes a furnace opening through which the boat 5 holding (or supporting) the wafers 6 is transferred (or loaded) into or transferred (or unloaded) out of the process chamber 7. Therefore, an inner diameter of the inner tube 3 is set to be greater than a maximum outer diameter of the boat 5 holding the wafers 6.

The outer tube 4 is of a cylindrical shape with a closed upper end and an open lower end. An inner diameter of the outer tube 4 is set to be greater than that of the inner tube 3. The outer tube 4 is aligned in a manner concentric with the inner tube 3 so as to surround an outer side of the inner tube 3. The lower end of the outer tube 4 is provided at a flange 9 of a manifold 8 via an O-ring (not shown), and is airtightly sealed by the O-ring.

The lower end of the inner tube 3 is placed on a ring structure 11 of a disk shape provided on an inner peripheral surface of the manifold 8. The inner tube 3 and the outer tube 4 are detachably attached to the manifold 8 such that a maintenance operation, an inspection operation or a cleaning operation for each of the inner tube 3 and the outer tube 4 can be performed. As the manifold 8 is supported by the housing (not shown), the process tube 2 is vertically installed.

As described above, the inner space of the inner tube 3 is referred to as the process chamber 7. However, hereinafter, an inner space of the outer tube 4 may also be referred to as the process chamber 7.

An exhaust pipe 12 through which an inner atmosphere of the process chamber 7 is exhausted is connected to a part of a side wall of the manifold 8. An exhaust port through which the inner atmosphere of the process chamber 7 is exhausted is provided at a connecting portion between the manifold 8 and the exhaust pipe 12. An inner side of the exhaust pipe 12 communicates via the exhaust port with an exhaust path 47, which is described later, formed (or defined) by a gap provided between the inner tube 3 and the outer tube 4. A cross-sectional shape of the exhaust path 47 is of a substantially circular ring shape. As a result, it is possible to uniformly exhaust the inner atmosphere of the process chamber 7 through an exhaust hole structure 13, which is described later, provided in the inner tube 3 from an upper end to a lower end of the exhaust hole structure 13. The exhaust hole structure 13 serves as a discharger (which is a discharge structure). That is, it is possible to uniformly exhaust the inner atmosphere of the process chamber 7 from the entirety of the wafers 6 accommodated in the boat 5.

A pressure sensor 14, an APC (Automatic Pressure Controller) valve 15 serving as a pressure regulator and a vacuum pump 16 serving as a vacuum exhaust apparatus are sequentially installed at the exhaust pipe 12 in this order from an upstream side to a downstream side of the exhaust pipe 12. The vacuum pump 16 is configured to be able to vacuum-exhaust the inner atmosphere of the process chamber 7 such that an inner pressure of the process chamber 7 reaches and is maintained at a predetermined pressure (vacuum degree). A controller 17 is electrically connected to the pressure sensor 14 and the APC valve 15. The controller 17 is configured to control an opening degree of the APC valve 15 based on a pressure detected by the pressure sensor 14 such that the inner pressure of the process chamber 7 reaches and is maintained at a desired pressure at a desired timing.

An exhauster (which is an exhaust structure or an exhaust system) according to the present embodiments is constituted mainly by the exhaust pipe 12, the pressure sensor 14 and the APC valve 15. The exhauster may further include the vacuum pump 16. For example, a trap apparatus configured to capture reaction by-products or an unreacted source gas in an exhaust gas (that is, the inner atmosphere of the process chamber 7 exhausted through the exhauster) or a detoxification apparatus configured to get rid of a corrosive component or a toxic component contained in the exhaust gas may be connected to the exhaust pipe 12. In such a case, the exhauster may further include the trap apparatus or the detoxification apparatus.

A seal cap 18 airtightly sealing a lower end opening of the manifold 8 is provided vertically under the manifold 8. The seal cap 18 is in contact with the lower end of the manifold 8 from thereunder. The seal cap 18 is of a disk shape, and an outer diameter of the seal cap 18 is equal to or greater than an outer diameter of the outer tube 4. The seal cap 18 is positioned in a horizontal orientation, and elevated or lowered in a vertical direction by a boat elevator 19 (described later) installed vertically outside the process tube 2.

The boat 5 holding the wafers 6 is vertically provided and supported on the seal cap 18. The boat 5 includes a pair of upper and lower end plates 21 and a plurality of support columns 22 provided between the upper and lower end plates 21 in the vertical direction. For example, each of the upper and lower end plates 21 and the plurality of support columns 22 are made of a heat resistant material such as quartz ($SiO_2$), silicon carbide (SiC), a composite material of the quartz and a composite material of the silicon carbide. A plurality of support recesses 23 are engraved at each of the support columns 22 at equal intervals in a lengthwise direction of each of the support columns 22. By inserting edges of the wafers 6 to the support recesses 23 engraved at the same stage of each of the support columns 22, respectively, the boat 5 supports the wafers 6 vertically arranged in a multistage manner while the wafers 6 are horizontally oriented with their centers aligned with one another.

A pair of upper and lower auxiliary end plates 24 are supported by a plurality of auxiliary support columns 25 between the boat 5 and the seal cap 18. A plurality of support recesses 26 are engraved at each of the auxiliary support columns 25. A plurality of heat insulating plates 27 of a disk shape are supported by the plurality of support recesses 26 in a horizontal orientation and in a multistage manner. For example, each of the plurality of heat insulating plates 27 is made of a heat resistant material such as quartz ($SiO_2$) and silicon carbide (SiC). With such a configuration, the plurality of heat insulating plates 27 are capable of suppressing the transmission of the heat from a heater 28 described later to the manifold 8. In addition, it is possible to suppress a temperature drop in a region below the wafers 6 accommodated in the boat 5.

A rotator 29 configured to rotate the boat 5 is provided at the seal cap 18 opposite to the process chamber 7. A rotating shaft 31 of the rotator 29 penetrates the seal cap 18 and supports the boat 5 from thereunder. As the rotator 29 rotates the rotating shaft 31, the wafers 6 in the process chamber 7 are rotated.

For example, the seal cap 18 may be elevated or lowered in the vertical direction by the boat elevator 19 serving as a transfer structure (transfer device). When the seal cap 18 is elevated or lowered in the vertical direction by the boat elevator 19, the boat 5 may be transferred (loaded) into the process chamber 7 or transferred (unloaded) out of the process chamber 7.

The heater 28 serving as a part of a heating structure (heating system) is provided outside the outer tube 4 so as to surround the outer tube 4. The heater 28 is capable of entirely heating an inner side of the process tube 2 such that a uniform temperature distribution or a predetermined temperature distribution of an inner temperature of the process tube 2 can be obtained. The heater 28 is vertically installed while being supported by the housing (not shown) of the substrate processing apparatus. For example, the heater 28 is configured as a resistance heating heater such as a carbon heater.

A temperature sensor 32 serving as a temperature detector is provided in the process tube 2. The heating structure (heating system) according to the present embodiments is constituted mainly by the heater 28 and the temperature sensor 32.

A spare chamber 33 of a channel shape is provided on a side wall of the inner tube 3 at a location opposite to the exhaust hole structure 13 by 180°. The spare chamber 33 protrudes outward in a radial direction of the inner tube 3 from the side wall of the inner tube 3 and extends along the vertical direction. In addition, an inner wall of the spare chamber 33 constitutes a part of an inner wall of the process chamber 7.

Nozzles 34, 35, 36 and 37 through which a gas such as a source gas and a reactive gas described later is supplied into the process chamber 7 are provided in the spare chamber 33. Each of the nozzles 34, 35, 36 and 37 is installed in the spare chamber 33 so as to extend in a stacking direction of the wafers 6 from a lower portion toward an upper portion of the spare chamber 33 along the inner wall of the spare chamber 33 (that is, the inner wall of the process chamber 7). That is, the nozzles 34, 35, 36 and 37 are installed in a region that is located beside and horizontally surrounds a wafer arrangement region (in which the wafers 6 are accommodated) to extend along the wafer arrangement region.

Figure 2:
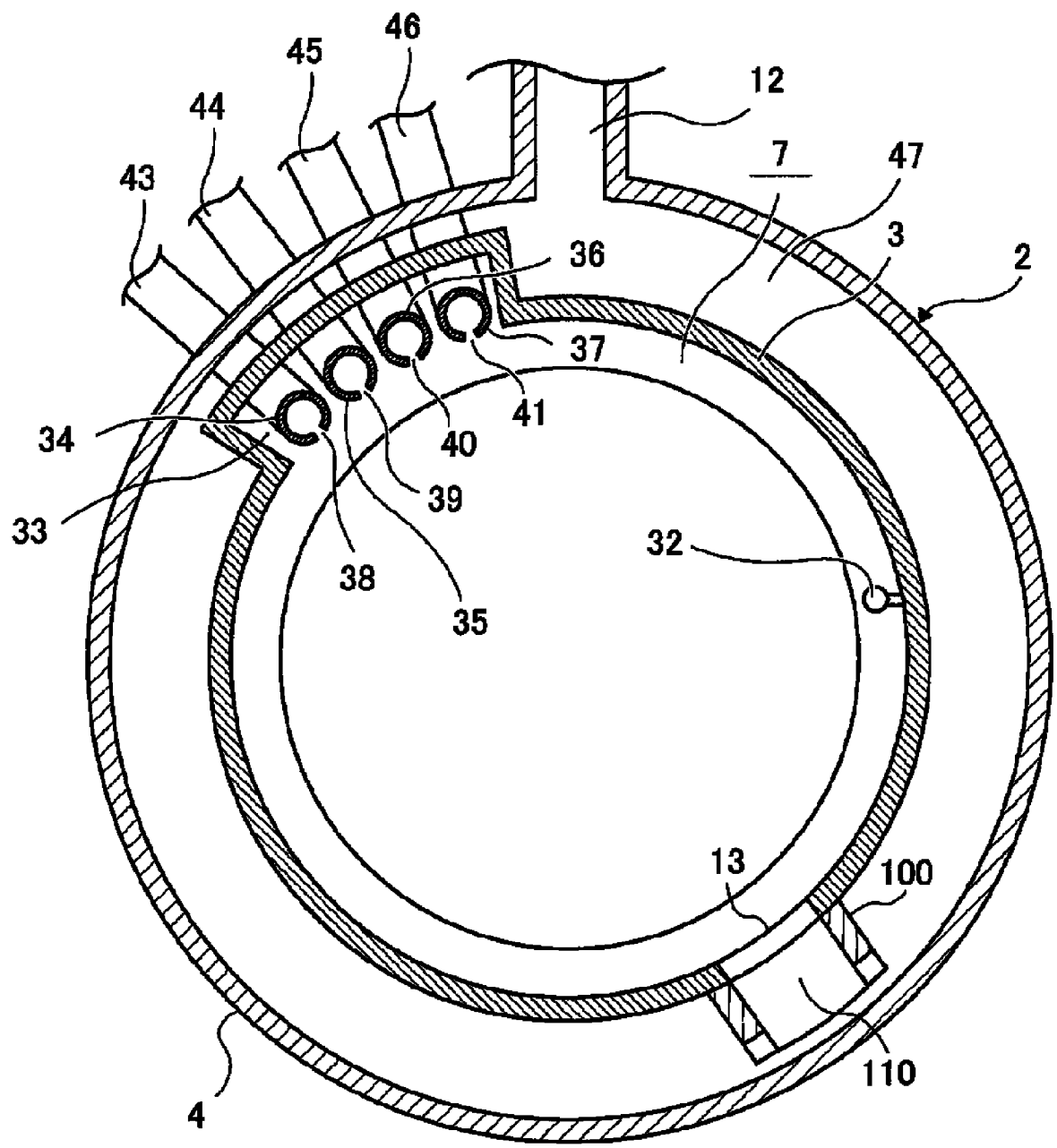
FIG. 2 is a diagram schematically illustrating a horizontal cross-section, taken along a line A-A shown in FIG. 1, of the process furnace of the substrate processing apparatus.

The nozzles 34, 35, 36 and 37 are installed such that horizontal portions of the nozzles 34, 35, 36 and 37 are installed so as to penetrate the manifold 8 and vertical portions of the nozzles 34, 35, 36 and 37 are installed in the spare chamber 33 so as to extend upward from a lower end toward an upper end of the wafer arrangement region. Although one nozzle 34 is shown in FIG. 1 for convenience, four nozzles 34, 35, 36 and 37 are actually provided as shown in FIG. 2.

A plurality of gas supply holes 38, a plurality of gas supply holes 39, a plurality of gas supply holes 40 and a plurality of gas supply holes 41 are provided at side surfaces of the nozzles 34, 35, 36 and 37, respectively. The gas such as the source gas and the reactive gas is supplied through the plurality of gas supply holes 38, the plurality of gas supply holes 39, the plurality of gas supply holes 40 and the plurality of gas supply holes 41. An opening area of each of the gas supply holes 38, the gas supply holes 39, the gas supply holes 40 and the gas supply holes 41 may be the same, or may be increased or decreased as it goes from a lower portion to an upper portion of each of the nozzles 34, 35, 36 and 37. Each of the gas supply holes 38, the gas supply holes 39, the gas supply holes 40 and the gas supply holes 41 is provided at the same pitch.

End portions of the horizontal portions of the nozzles 34, 35, 36 and 37 penetrating the manifold 8 are connected to gas supply pipes 43, 44, 45 and 46 serving as gas supply lines provided outside the process tube 2, respectively.

As described above, according to the present embodiments, the gas such as the source gas and the reactive gas is supplied through the nozzles 34, 35, 36 and 37 provided in the spare chamber 33. The nozzles 34, 35, 36 and 37 serve as a gas supplier (which is a gas supply structure or a gas supply system). Then, the gas is ejected into the process chamber 7 in the vicinity of the wafers 6 through the plurality of gas supply holes 38, the plurality of gas supply holes 39, the plurality of gas supply holes 40 and the plurality of gas supply holes 41.

A mass flow controller (MFC) (not shown) serving as a flow rate controller (flow rate control structure) and a valve (not shown) serving as an opening/closing valve are sequentially installed at the gas supply pipe 43 in this order from an upstream side to a downstream side of the gas supply pipe 43 in a gas flow direction. For example, nitrogen ($N_2$) gas serving as an inert gas is supplied to the process chamber 7 through the gas supply pipe 43 and the nozzle 34. A first inert gas supplier (which is a first inert gas supply structure or a first inert gas supply system) is constituted mainly by the nozzle 34, the gas supply pipe 43, the MFC provided at the gas supply pipe 43 and the valve provided at the gas supply pipe 43.

A mass flow controller (MFC) (not shown) serving as a flow rate controller (flow rate control structure) and a valve (not shown) serving as an opening/closing valve are sequentially installed at the gas supply pipe 46 in this order from an upstream side to a downstream side of the gas supply pipe 46 in the gas flow direction. For example, the nitrogen ($N_2$) gas serving as an inert gas is supplied to the process chamber 7 through the gas supply pipe 46 and the nozzle 37. A second inert gas supplier (which is a second inert gas supply structure or a second inert gas supply system) is constituted mainly by the nozzle 37, the gas supply pipe 46, the MFC provided at the gas supply pipe 46 and the valve provided at the gas supply pipe 46.

An inert gas supplier (which is an inert gas supply structure or an inert gas supply system) is constituted by at least one among the first inert gas supplier and the second inert gas supplier. The first inert gas supplier and the second inert gas supplier may be used independently depending on a processing (that is, a substrate processing described later) of the wafer 6. However, by using both the first inert gas supplier and the second inert gas supplier, it is possible to process the wafers 6 uniformly. In addition, as shown in FIG. 2, it is preferable that the nozzle 34 and the nozzle 37 are arranged such that another nozzle (or nozzles) is (or are) interposed therebetween. With such a configuration, it is possible to improve a process uniformity of the wafers 6.

A reactive gas supply source (not shown), a mass flow controller (MFC) (not shown) serving as a flow rate controller (flow rate control structure) and a valve (not shown) serving as an opening/closing valve are sequentially installed at the gas supply pipe 44 in this order from an upstream side to a downstream side of the gas supply pipe 44 in the gas flow direction. For example, the reactive gas is supplied to the process chamber 7 through the gas supply pipe 44 and the nozzle 35. A reactive gas supplier (which is a reactive gas supply structure or a reactive gas supply system) is constituted mainly by the nozzle 35, the gas supply pipe 44, the MFC provided at the gas supply pipe 44 and the valve provided at the gas supply pipe 44.

A reactive gas activator (which is a reactive gas activating structure) (not shown) may be installed at the gas supply pipe 44. For example, the reactive gas activator may be configured to activate a predetermined gas to generate the reactive gas and supply the reactive gas to the process chamber 7.

A source gas supply source (not shown), a mass flow controller (MFC) (not shown) serving as a flow rate controller (flow rate control structure) and a valve (not shown) serving as an opening/closing valve are sequentially installed at the gas supply pipe 45 in this order from an upstream side to a downstream side of the gas supply pipe 45 in the gas flow direction. For example, the source gas is supplied to the process chamber 7 through the gas supply pipe 45 and the nozzle 36. A source gas supplier (which is a source gas supply structure or a source gas supply system) is constituted mainly by the nozzle 36, the gas supply pipe 45, the MFC provided at the gas supply pipe 45 and the valve provided at the gas supply pipe 45.

A vaporizer (which is a vaporizing system or a vaporizing structure) (not shown) may be installed at the gas supply pipe 45. For example, the vaporizer may be configured to vaporize a liquid source (which is a source material of the source gas) to generate a vaporized gas serving as the source gas and supply the source gas to the process chamber 7. In such a case, a valve (not shown) serving as an opening/closing valve, a gas filter (not shown) and the like are sequentially installed at the gas supply pipe 45 in this order from the upstream side to the downstream side of the gas supply pipe 45 at a downstream side of the vaporizer.

Figure 3:
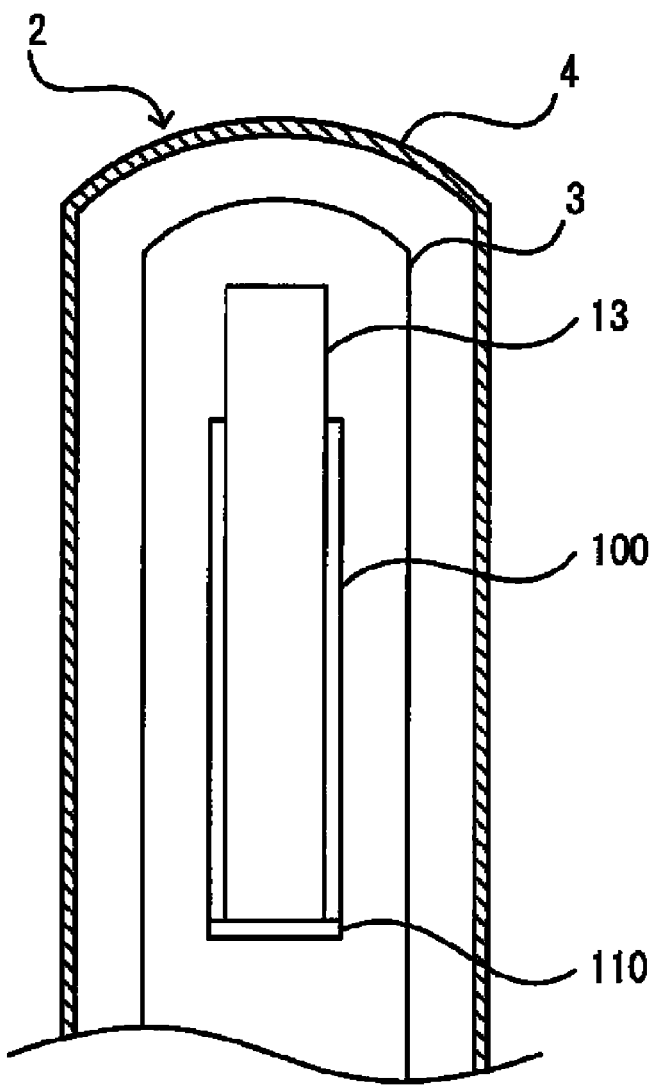
FIG. 3 is a diagram schematically illustrating a cross-section of the process furnace of the substrate processing apparatus as viewed along an arrow B shown in FIG. 1.

The exhaust hole structure 13 is provided at the side wall of the inner tube 3 so as to face the nozzles 34, 35, 36 and 37. That is, the exhaust hole structure 13 is provided at a location opposite to the spare chamber 33 by 180°. According to the present embodiments, for example, the exhaust hole structure 13 is constituted by a narrow quadrangular opening elongated in the vertical direction as shown in FIG. 3.

Further, fins including a fin 100 serving as an adjusting structure configured to suppress a flow of the gas discharged (or exhausted) from the exhaust hole structure 13 are provided at both sides of the exhaust hole structure 13. Hereinafter, the fins including the fin 100 may also be simply referred to as "fins 100". By adjusting the flow of the gas from the plurality of gas supply holes 38, the plurality of gas supply holes 39, the plurality of gas supply holes 40 and the plurality of gas supply holes 41 to the exhaust hole structure 13 in the process chamber 7 by using the fins 100, it is possible to uniformize the flow of the gas discharged from the exhaust hole structure 13. According to the present embodiments, for example, each of the fins 100 is of a staircase shape as shown in FIG. 4.

A spatial ratio (Wf/Ws) of a width Wf of the fin 100 to a width Ws of a space provided between the inner tube 3 and the outer tube 4 is set to be within a range from 0.2 to 0.9 in the entire region of the fin 100 along the vertical direction.

Specifically, the exhaust hole structure 13 is divided into nine sections in the vertical direction, and the fin 100 is not provided in the uppermost section ("FIRST SECTION" shown in FIG. 4). The fin 100 is provided over the second to ninth sections from the top. For example, the spatial ratio of the second section ("SECOND SECTION" shown in FIG. 4) from the top is set to 0.21, the spatial ratio of the third section ("THIRD SECTION" shown in FIG. 4) from the top is set to 0.34, the spatial ratio of the fourth section ("FOURTH SECTION" shown in FIG. 4) from the top is set to 0.46, the spatial ratio of the fifth section ("FIFTH SECTION" shown in FIG. 4) from the top is set to 0.58, the spatial ratio of the sixth section ("SIXTH SECTION" shown in FIG. 4) from the top is set to 0.68, the spatial ratio of the seventh section ("SEVENTH SECTION" shown in FIG. 4) from the top is set to 0.75, the spatial ratio of the eighth section ("EIGHTH SECTION" shown in FIG. 4) from the top is set to 0.81, and the spatial ratio of the ninth section ("NINTH SECTION" shown in FIG. 4) from the top is set to 0.84. That is, the fin 100 is configured to suppress the flow of the gas (or a part of the gas) discharged from the exhaust hole structure 13.

The two fins 100 at both sides of the exhaust hole structure 13 are fixed to an outer wall of the inner tube 3. Further, a pedestal 110 supporting the fins 100 in the vicinity of the exhaust hole structure 13 is fixed to the outer wall of the inner tube 3. According to the present embodiments, for example, the pedestal 110 is of a plate shape, and is arranged such that the lower end of the exhaust hole structure 13 and an upper surface of the pedestal 110 are at the same height. Lower ends of the two fins 100 are fixed to the upper surface of the pedestal 110.

The exhaust path 47 is formed by the gap provided between the inner tube 3 and the outer tube 4, and the exhaust path 47 communicates with the process chamber 7 through the exhaust hole structure 13. Therefore, the gas supplied into the process chamber 7 through the plurality of gas supply holes 38, the plurality of gas supply holes 39, the plurality of gas supply holes 40 and the plurality of gas supply holes 41 flows into the exhaust path 47 through the exhaust hole structure 13, is supplied into the exhaust pipe 12 through the exhaust port provided below the exhaust hole structure 13, and is discharged (exhausted) out of the process tube 2.

The gas supplied into the vicinity of the wafers 6 in the process chamber 7 through the plurality of gas supply holes 38, the plurality of gas supply holes 39, the plurality of gas supply holes 40 and the plurality of gas supply holes 41 flows in a horizontal direction (that is, in a direction parallel to surfaces of the wafers 6). The gas that has flown in the horizontal direction is exhausted through the exhaust hole structure 13 into the exhaust path 47. That is, the gas ejected into the process chamber 7 mainly flows parallel to the surfaces of the wafers 6, that is, in the horizontal direction.

Figure 5A:
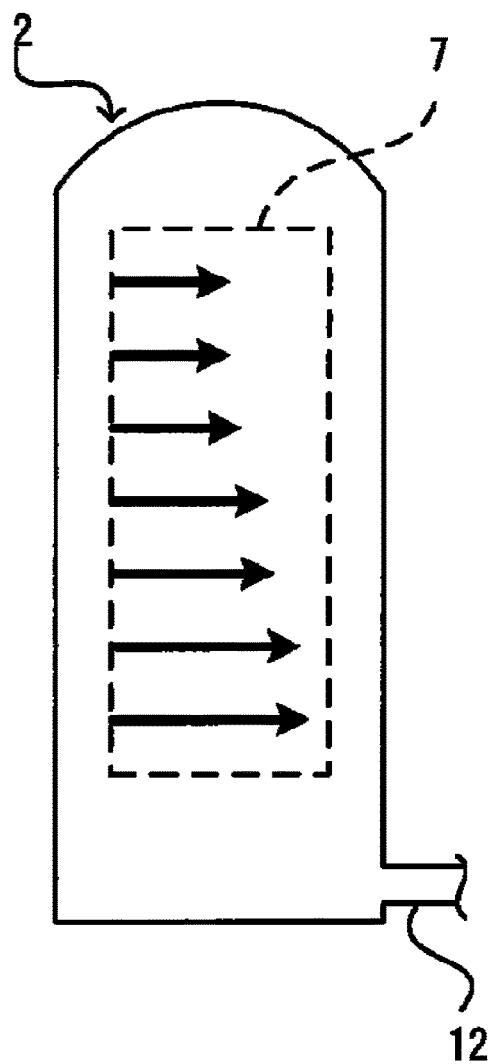
FIGS. 5A and 5B are diagrams for explaining a flow of a gas in the process furnace of the substrate processing apparatus preferably used in the embodiments of the present disclosure, more specifically.

In such a case, a pressure in the exhaust hole structure 13 extending in the vertical direction decreases at a location close to the exhaust pipe 12 and increases at a location far from the exhaust pipe 12. Therefore, when the fins 100 are not provided, as shown in FIG. 5A, a flow velocity of the gas at a lower portion of an arrangement region of the wafers 6 (which is closer to the exhaust pipe 12 than an upper portion of the arrangement region of the wafers 6) is higher than the flow velocity of the gas at the upper portion of the arrangement region of the wafers 6. As a result, a pressure difference occurs between the upper portion and the lower portion of the arrangement region of the wafers 6 in the process chamber 7. Hereinafter, the arrangement region of the wafers 6 may also be referred to as a "substrate arrangement region".

Figure 5B:
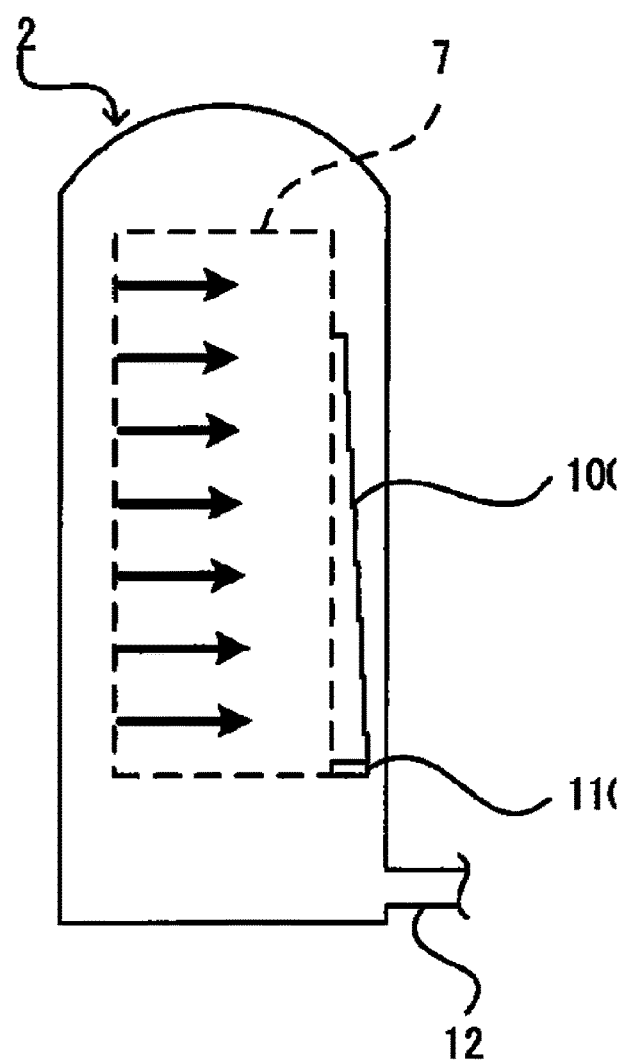

On the other hand, according to the present embodiments, the fins 100 serving as adjusting structures configured to suppress the flow of the gas discharged from the exhaust hole structure 13 are provided at the outer wall of the inner tube 3, and the flow of the gas from the plurality of gas supply holes 38, the plurality of gas supply holes 39, the plurality of gas supply holes 40 and the plurality of gas supply holes 41 to the exhaust hole structure 13 in the process chamber 7 is adjusted by using the fins 100. According to the present embodiments, for example, each of the fins 100 is of a staircase shape which becomes wider toward the bottom, and is configured such that the flow of the gas can be further suppressed at a location closer to the bottom of the exhaust hole structure 13. That is, by increasing the width Wf of each of the fins 100 in the location where the pressure is lower and the gas flows more easily and by increasing the pressure in the vicinity of the exhaust hole structure 13, it is possible to suppress the flow of the gas so as to make it difficult for the gas to flow in the vicinity of the exhaust hole structure 13. As a result, as shown in FIG. 5B, it is possible to uniformize in the vertical direction the flow of the gas from the plurality of gas supply holes 38, the plurality of gas supply holes 39, the plurality of gas supply holes 40 and the plurality of gas supply holes 41 to the exhaust hole structure 13 in the process chamber 7, and it is also possible to uniformize the flow of the gas at an upper portion and a lower portion of the exhaust hole structure 13. In addition, it is possible to reduce the pressure difference between the upper portion and the lower portion of the arrangement region of the wafers 6 of the process chamber 7 so as to uniformize the pressure.

FIG. 6 is a diagram schematically illustrating the flow velocity of the gas directly above the wafers 6 in the process chamber 7 of the process tube 2 according to the present embodiments. A horizontal axis of a graph shown in FIG. 6 indicates a height from the upper surface of the pedestal 110 (which is the same as a height from the lower end of the exhaust hole structure 13), and a height of the upper end of the exhaust hole structure 13 is standardized as 1. A vertical axis on a left portion of the graph shown in FIG. 6 indicates the spatial ratio (Wf/Ws) of the fin 100, and the width Ws of the space provided between the inner tube 3 and the outer tube 4 is standardized as 1. A vertical axis on a right portion of the graph shown in FIG. 6 indicates the flow velocity of the gas directly above the wafers 6, and the flow velocity of the gas directly above the wafers 6 at the lower end of the exhaust hole structure 13 is standardized as 1.

A solid line in the graph shown in FIG. 6 indicates the spatial ratio (Wf/Ws) of the fin 100. A dash-dotted line in the graph shown in FIG. 6 indicates the flow velocity of the gas directly above the wafers 6 when the fin 100 is provided. A dotted line in the graph shown in FIG. 6 indicates the flow velocity of the gas directly above the wafers 6 when the fin 100 is not provided. It can be seen from the graph of FIG. 6 that, by providing the fin 100, a difference in the flow velocity of the gas between the upper portion and the lower portion of the arrangement region of the wafers 6 in the process chamber 7 can be reduced as compared with a case where the fin 100 is not provided, and the flow velocity of the gas can be uniformized.

Figure 7:
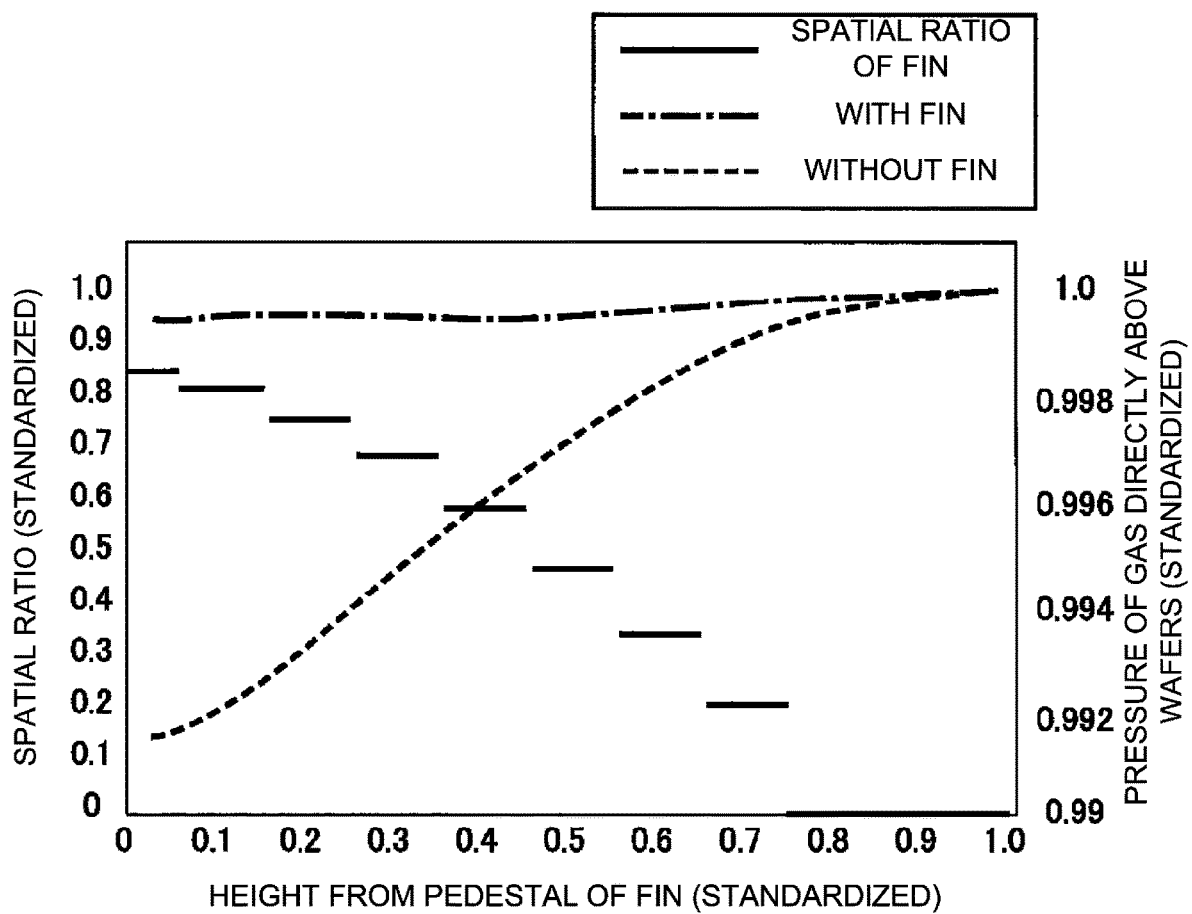
FIG. 7 is a diagram schematically illustrating a pressure of the gas in the process furnace of the substrate processing apparatus preferably used in the embodiments of the present disclosure.

FIG. 7 is a diagram schematically illustrating the pressure of the gas directly above the wafers 6 in the process chamber 7 of the process tube 2 according to the present embodiments. A horizontal axis of a graph shown in FIG. 7 indicates the height from the upper surface of the pedestal 110 (which is the same as the height from the lower end of the exhaust hole structure 13), and the height of the upper end of the exhaust hole structure 13 is standardized as 1. A vertical axis on a left portion of the graph shown in FIG. 7 indicates the spatial ratio (Wf/Ws) of the fin 100, and the width Ws of the space provided between the inner tube 3 and the outer tube 4 is standardized as 1. A vertical axis on a right portion of the graph shown in FIG. 7 indicates the pressure of the gas directly above the wafers 6, and the pressure of the gas directly above the wafers 6 at the upper end of the exhaust hole structure 13 is standardized as 1.

A solid line in the graph shown in FIG. 7 indicates the spatial ratio (Wf/Ws) of the fin 100. A dash-dotted line in the graph shown in FIG. 7 indicates the pressure of the gas directly above the wafers 6 when the fin 100 is provided. A dotted line in the graph shown in FIG. 7 indicates the pressure of the gas directly above the wafers 6 when the fin 100 is not provided. It can be seen from the graph of FIG. 7 that, by providing the fin 100, a difference in the pressure of the gas between the upper portion and the lower portion of the arrangement region of the wafers 6 in the process chamber 7 can be reduced as compared with a case where the fin 100 is not provided, and the pressure of the gas can be uniformized.

As described above, by using the configuration of the present embodiments, it is possible to uniformize the flow of the gas discharged from the exhaust hole structure 13 in the vertical direction by reducing the pressure difference in the arrangement region of the wafers 6 in the process chamber 7 along the vertical direction. Therefore, it is possible to uniformly supply the gas to each of the wafers 6, and it is also possible to uniformize a thickness of a film formed on each of the wafers 6.

Figure 8:
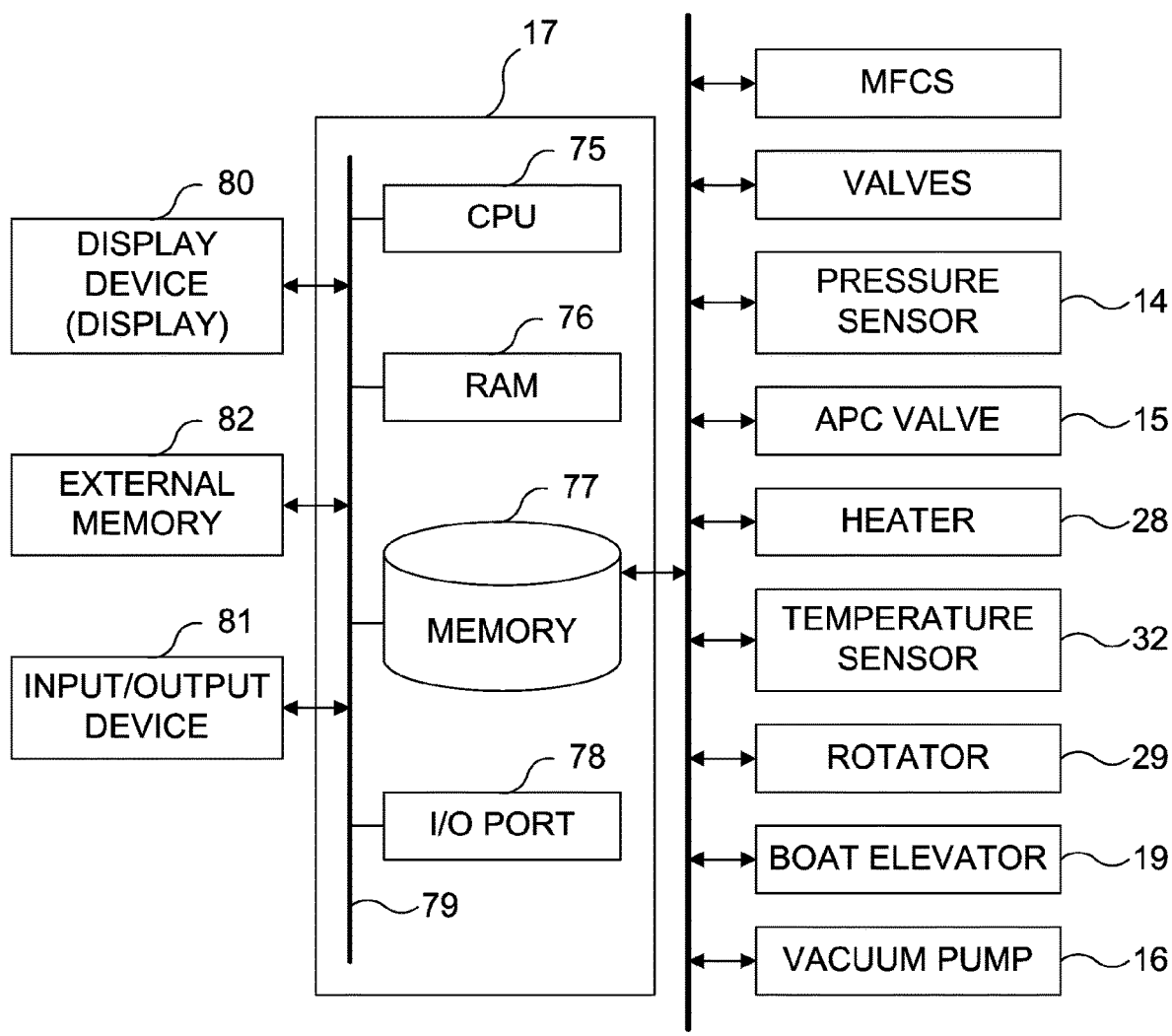
FIG. 8 is a block diagram schematically illustrating a configuration of a controller and related components of the substrate processing apparatus preferably used in the embodiments of the present disclosure.

Subsequently, the controller 17 serving as a control structure (control device) and related components connected thereto will be described with reference to FIG. 8.

The controller 17 is constituted by a computer including a CPU (Central Processing Unit) 75, a RAM (Random Access Memory) 76, a memory 77 and an I/O port 78. The RAM 76, the memory 77 and the I/O port 78 may exchange data with the CPU 75 through an internal bus 79. For example, a display 80 such as a display device and an input/output device 81 such as a touch panel may be connected to the controller 17.

The memory 77 is configured by a component such as a flash memory and a hard disk drive (HDD). For example, a control program configured to control the operation of the substrate processing apparatus or a process recipe containing information on the sequences and conditions of the substrate processing described later is readably stored in the memory 77. The process recipe is obtained by combining steps of the substrate processing described later such that the controller 17 can execute the steps to acquire a predetermined result, and functions as a program. Hereafter, the process recipe and the control program may be collectively or individually referred to as a "program". In the present specification, the term "program" may refer to the process recipe alone, may refer to the control program alone, or may refer to a combination of the process recipe and the control program. The RAM 76 functions as a memory area (work area) where a program or data read by the CPU 75 is temporarily stored.

The I/O port 78 is connected to the above-described components constituting the substrate processing apparatus such as the MFCs and the valves provided at the gas supply pipes 43, 44, 45 and 46, the pressure sensor 14, the APC valve 15, the vacuum pump 16, the boat elevator 19, the heater 28, the rotator 29 and the temperature sensor 32.

The CPU 75 is configured to read the control program from the memory 77 and execute the read control program. In addition, the CPU 75 is configured to read the process recipe from the memory 77 in accordance with an operation command inputted from the input/output device 81. According to the contents of the read process recipe, the CPU 75 may be configured to control various operations such as flow rate adjusting operations for various gases by the MFCs described above, opening and closing operations of the valves described above, an opening and closing operation of the APC valve 15, a pressure adjusting operation by the APC valve 15 based on the pressure sensor 14, a temperature adjusting operation by the heater 28 based on the temperature sensor 32, a start and stop of the vacuum pump 16, an operation of adjusting the rotation and the rotation speed of the boat 5 by the rotator 29 and an elevating and lowering operation of the boat 5 by the boat elevator 19.

The controller 17 may be embodied by a dedicated computer or by a general-purpose computer. According to the present embodiments, for example, the controller 17 may be embodied by preparing an external memory 82 storing the above-described program and by installing the program onto the general-purpose computer using the external memory 82. For example, the external memory 82 may include a semiconductor memory such as a USB flash memory (USB flash drive) and a memory card. A method of providing the program to the computer is not limited to the external memory 82. For example, the program may be supplied to the computer (general-purpose computer) by using communication means such as the Internet and a dedicated line instead of the external memory 82. The memory 77 or the external memory 82 may be embodied by a non-transitory computer readable recording medium. Hereafter, the memory 77 and the external memory 82 may be collectively or individually referred to as a "recording medium". In the present specification, the term "recording medium" may refer to the memory 77 alone, may refer to the external memory 82 alone or may refer to both of the memory 77 and the external memory 82.

Figure 9:
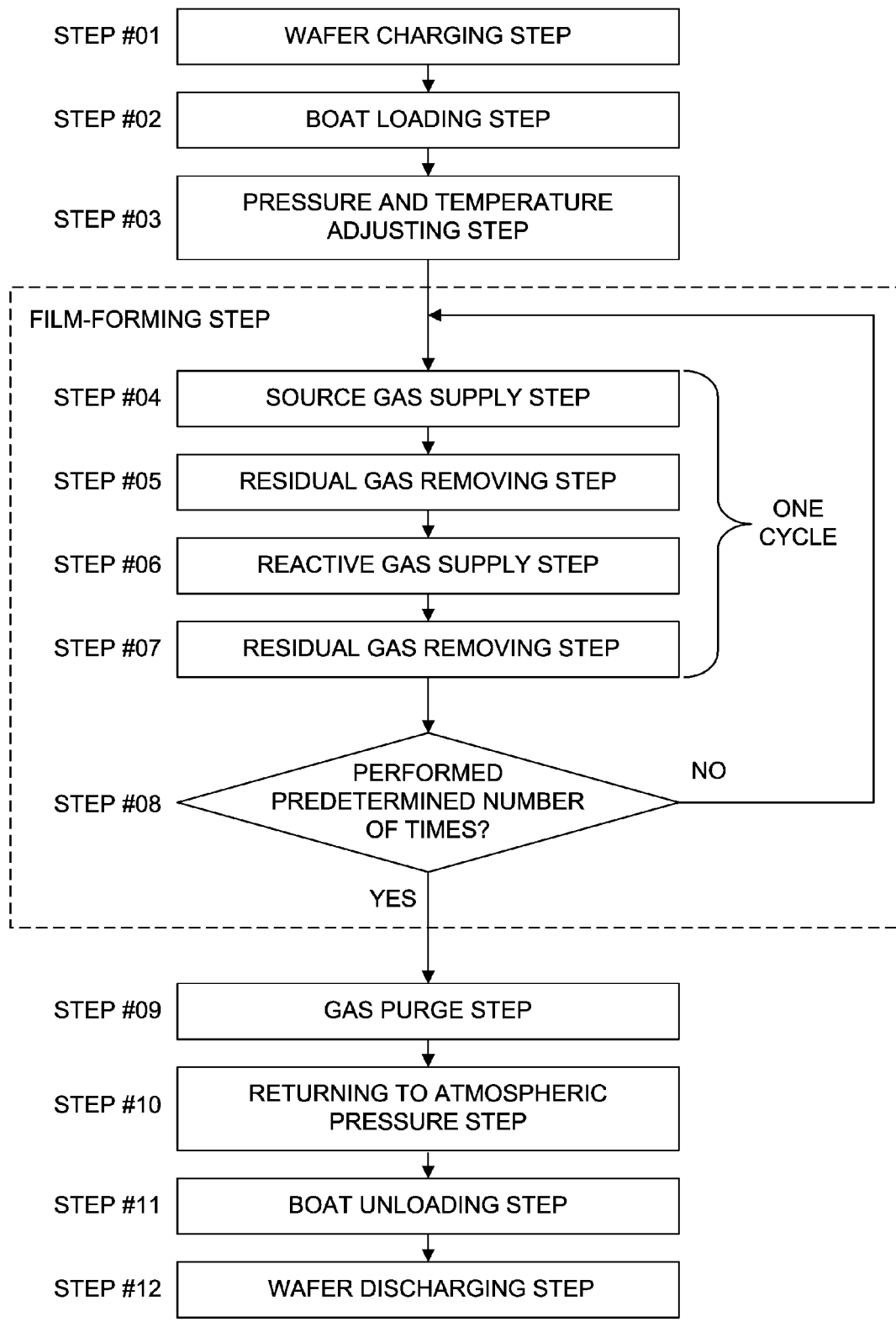
FIG. 9 is a flow chart schematically illustrating a process of forming a zirconium oxide film on a substrate by using the substrate processing apparatus preferably used in the embodiments of the present disclosure.

Hereinafter, an exemplary sequence of the substrate processing (that is, the film-forming process) of forming a film on a substrate (that is, the wafer 6), which is a part of the manufacturing process of the semiconductor device by using the process furnace 1 of the substrate processing apparatus described above, will be described with reference to FIG. 9. Hereinafter, operations of the components constituting the substrate processing apparatus are controlled by the controller 17.

In the present specification, the term "wafer" may refer to "a wafer itself", or may refer to "a wafer and a stacked structure (aggregated structure) of a predetermined layer (or layers) or a film (or films) formed on a surface of a wafer". That is, the term "wafer" may collectively refer to the wafer and the layers or the films formed on the surface of the wafer. In the present specification, the term "a surface of a wafer" may refer to "a surface (exposed surface) of a wafer itself", or may refer to "a surface of a predetermined layer or a film formed on a wafer, i.e. a top surface (uppermost surface) of the wafer as a stacked structure".

Thus, in the present specification, "supplying a predetermined gas to a wafer" may refer to "directly supplying a predetermined gas to a surface (exposed surface) of a wafer itself" or may refer to "supplying a predetermined gas to a predetermined layer or a film formed on a wafer, i.e. a top surface (uppermost surface) of the wafer as a stacked structure". In the present specification "forming a predetermined layer (or film) on a wafer" may refer to "directly forming a predetermined layer (or film) on a surface of (exposed surface) of a wafer itself" or may refer to "forming a predetermined layer (or film) on a layer or a film formed on a wafer, i.e. a top surface (uppermost surface) of the wafer as a stacked structure".

In the present specification, the terms "substrate" and "wafer" may be used as substantially the same meaning. That is, the term "substrate" may be substituted by "wafer" and vice versa.

Hereinafter, the substrate processing will be described.

STEP #01

First, the wafers 6 are transferred (charged) into the boat 5 (wafer charging step).

STEP #02

The boat 5 charged with the wafers 6 is elevated by the boat elevator 19 and loaded (transferred) into the process chamber 7 (boat loading step). With the boat 5 loaded, the seal cap 18 airtightly seals the lower end of the manifold 8.

STEP #03

After the boat 5 is loaded into the process chamber 7, the vacuum pump 16 vacuum-exhausts the inner atmosphere of the process chamber 7 until the inner pressure of the process chamber 7 reaches and is maintained at a desired pressure (vacuum degree). In the STEP #03, the inner pressure of the process chamber 7 is measured by the pressure sensor 14, and the APC valve 15 is feedback-controlled based on pressure information measured by the pressure sensor 14 (pressure adjusting step). In the STEP #03, the heater 28 heats the process chamber 7 until an inner temperature of the process chamber 7 reaches and is maintained at a desired temperature. In the STEP #03, the state of the electric current supplied to the heater 28 is feedback-controlled based on temperature information detected by the temperature sensor 32 such that a desired temperature distribution of the inner temperature of the process chamber 7 is obtained (temperature adjusting step). Subsequently, as the rotator 29 rotates the boat 5, the wafers 6 are rotated.

The vacuum pump 16 continuously vacuum-exhausts the inner atmosphere of the process chamber 7, the heater 28 continuously heats the process chamber 7, and the rotator 29 continuously rotates the boat 5 and the wafers 6 until at least the processing of the wafers 6 is completed.

Subsequently, a film-forming step of forming the film is performed by supplying the source gas and the reactive gas to the process chamber 7. In the oxide film-forming step, steps of STEP #04, STEP #05, STEP #06, STEP #07 and STEP #8 are sequentially performed.

STEP #04

First, the valve provided at the gas supply pipe 45 is opened to supply the source gas into the gas supply pipe 45.

For example, the source gas supplied in the gas supply pipe 45 is supplied to the process chamber 7 through the plurality of gas supply holes 40 of the nozzle 36 in a state where the liquid source is vaporized by the vaporizer (not shown) to generate the source gas, and is exhausted through the exhaust pipe 12.

In the STEP #04, in parallel with a supply of the source gas, the inert gas such as the $N_2$ gas is supplied through the gas supply pipe 43, the nozzle 34 and the plurality of gas supply holes 38, and the inert gas such as the $N_2$ gas is supplied through the gas supply pipe 46, the nozzle 37 and the plurality of gas supply holes 41.

In the STEP #04, the opening degree of the APC valve 15 is appropriately adjusted (controlled) to adjust the inner pressure of the process chamber 7 to a predetermined pressure. According to the present embodiments, a supply time (time duration) of supplying (exposing) the source gas to the wafers 6 may be set to a predetermined amount of time. In the STEP #04, a temperature of the heater 28 may be set such that a temperature of the wafer 6 reaches and is maintained at a predetermined temperature.

STEP #05

Then, the supply of the source gas to the process chamber 7 is stopped. In the STEP #05, with the APC valve 15 of the exhaust pipe 12 open, the vacuum pump 16 vacuum-exhausts the inner atmosphere of the process chamber 7 to remove a residual gas in the process chamber 7 such as the source gas which did not react or which contributed to the formation of a source-containing layer (which is formed in the STEP #4) out of the process chamber 7.

In the STEP #05, the $N_2$ gas serving as the inert gas is continuously supplied into the process chamber 7. The $N_2$ gas serves as a purge gas, which improves the efficiency of removing the residual gas in the process chamber 7 such as the source gas which did not react or which contributed to the formation of the source-containing layer out of the process chamber 7.

In the STEP #05, the gas remaining in the process chamber 7 may not be completely discharged (or exhausted) or the process chamber 7 may not be completely purged. Even when a small amount of the gas remains in the process chamber 7, the small amount of the gas remaining in the process chamber 7 does not adversely affect a subsequent step (that is, the STEP #06). Therefore, in the STEP #05, the $N_2$ gas may not be supplied into the process chamber 7 at a large flow rate. For example, a purge operation of purging the process chamber 7 may be performed by supplying the $N_2$ gas of an amount substantially equal to a volume of the outer tube 4 (or the process chamber 7) such that the STEP #06 will not be adversely affected. By not completely purging the process chamber 7 as described above, it is possible to shorten a purge time for purging the process chamber 7, and to improve the throughput. It is also possible to reduce the consumption of the $N_2$ gas to the minimum.

STEP #06

After the residual gas in the process chamber 7 is removed, the valve provided at the gas supply pipe 44 is opened to supply the reactive gas into the process chamber 7. Specifically, a flow rate of the reactive gas is adjusted by the MFC provided at the gas supply pipe 44. Then, the reactive gas whose flow rate is adjusted is supplied into the process chamber 7 through the plurality of gas supply holes 39 of the nozzle 35, and is exhausted through the exhaust pipe 12. In the STEP #06, in parallel with a supply of the reactive gas, the inert gas such as the $N_2$ gas is supplied through the gas supply pipe 43, the nozzle 34 and the plurality of gas supply holes 38, and the inert gas such as the $N_2$ gas is supplied through the gas supply pipe 46, the nozzle 37 and the plurality of gas supply holes 41.

In the STEP #06, when the reactive gas is supplied, the opening degree of the APC valve 15 is appropriately adjusted (controlled) to adjust the inner pressure of the process chamber 7 to a predetermined pressure. In addition, a supply time (time duration) of supplying (exposing) the reactive gas to the wafers 6 may be set to a predetermined amount of time. In the STEP #06, the temperature of the heater 28 may be set to a predetermined temperature such that the temperature of the wafer 6 reaches and is maintained at the predetermined temperature. By supplying the reactive gas, a desired film is formed from the source-containing layer formed on the wafer 6 in the STEP #04.

STEP #07

After the desired film is formed, the supply of the reactive gas to the process chamber 7 is stopped. In the STEP #07, with the APC valve 15 of the exhaust pipe 12 open, the vacuum pump 16 vacuum-exhausts the inner atmosphere of the process chamber 7 to remove a residual gas in the process chamber 7 such as the reactive gas which did not react or which contributed to the formation of the desired film out of the process chamber 7.

In the STEP #07, the $N_2$ gas serving as the inert gas is continuously supplied into the process chamber 7. The $N_2$ gas serves as the purge gas, which improves the efficiency of removing the residual gas in the process chamber 7 such as the reactive gas which did not react or which contributed to the formation of the desired film out of the process chamber 7.

In the STEP #07, the gas remaining in the process chamber 7 may not be completely discharged (or exhausted) or the process chamber 7 may not be completely purged. Even when a small amount of the gas remains in the process chamber 7, the small amount of the gas remaining in the process chamber 7 does not adversely affect the STEP #04 when the STEP #04 is performed again. Therefore, in the STEP #07, the $N_2$ gas may not be supplied into the process chamber 7 at a large flow rate. For example, the purge operation of purging the process chamber 7 may be performed by supplying the $N_2$ gas of an amount substantially equal to the volume of the outer tube 4 (or the process chamber 7) such that the STEP #04 will not be adversely affected. By not completely purging the process chamber 7 as described above, it is possible to shorten the purge time for purging the process chamber 7, and to improve the throughput. It is also possible to reduce the consumption of the $N_2$ gas to the minimum.

STEP #08

In the STEP #08, the controller 17 determines whether a cycle including the STEP #04, the STEP #05, the STEP #06 and the STEP #07 is performed a predetermined number of times. By performing the cycle at least once, it is possible to form a film of a predetermined thickness on the wafer 6. It is preferable that the cycle described above is repeatedly performed a plurality of times. By performing the cycle described above a plurality of times, it is possible to form the film of the predetermined thickness on the wafer 6.

STEP #09

After the desired film is formed, the $N_2$ gas is supplied into the process chamber 7. The $N_2$ gas serves as the purge gas. Thereby, the process chamber 7 is purged with the inert gas, and the gas remaining in the process chamber 7 is removed out of the process chamber 7.

STEP: 10

STEP #10

After the inner atmosphere of the process chamber 7 is replaced with the inert gas, the inner pressure of the process chamber 7 is returned to the normal pressure (atmospheric pressure) (returning to atmospheric pressure step).

STEP #11

Thereafter, the seal cap 18 is lowered by the boat elevator 19 and the lower end of the manifold 8 is opened. The boat 5 with the processed wafers 6 charged therein is unloaded out of the process tube 2 through the lower end of the manifold 8 (boat unloading step).

STEP #12

Finally, the processed wafers 6 are transferred (discharged) out of the boat 5 (wafer discharging step). Thereby, the substrate processing is completed.

Modified Examples

While the present embodiments are described by way of an example in which the exhaust hole structure 13 is constituted by the quadrangular opening extending in the vertical direction, the present embodiments are not limited thereto, and the present embodiments may be modified in various ways without departing from the scope thereof.

Figure 10:
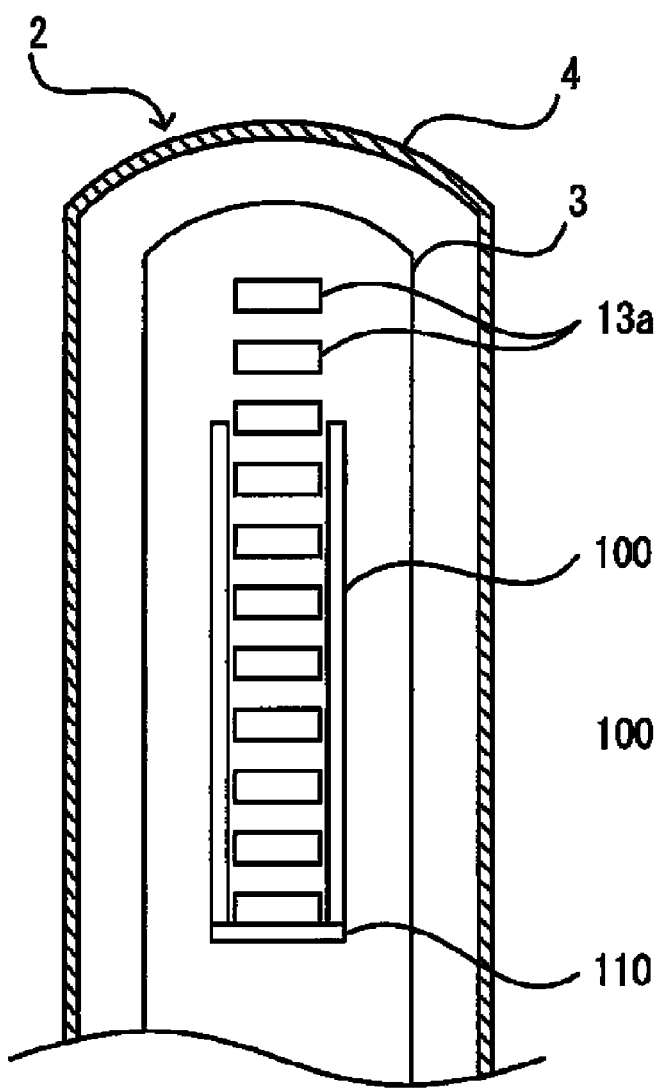
FIG. 10 is a diagram schematically illustrating a modified example of an exhaust hole structure in a process tube of the substrate processing apparatus preferably used in the embodiments of the present disclosure, wherein a plurality of small quadrangular openings elongated in a horizontal direction are arranged in a vertical direction as the exhaust hole structure.

For example, as shown in an exhaust hole structure 13a of FIG. 10, a plurality of small quadrangular openings elongated in a horizontal direction may be arranged in the vertical direction as the exhaust hole structure.

Figure 11:
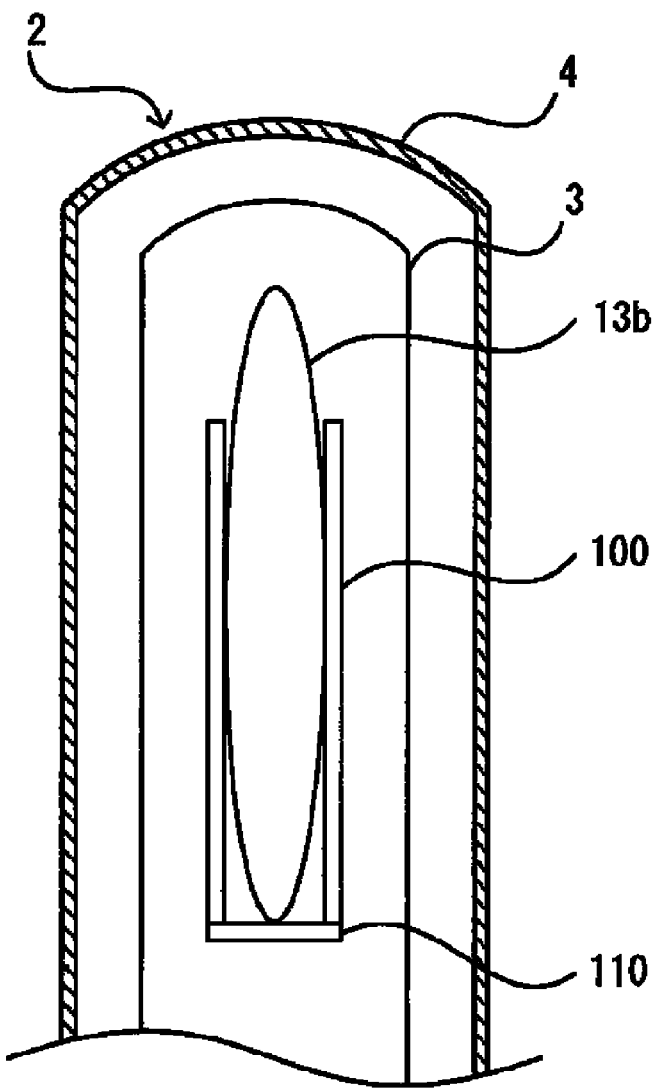
FIG. 11 is a diagram schematically illustrating another modified example of the exhaust hole structure in the process tube of the substrate processing apparatus preferably used in the embodiments of the present disclosure, wherein an elliptical opening extending in the vertical direction is provided as the exhaust hole structure.

For example, as shown in an exhaust hole structure 13b of FIG. 11, an elliptical opening extending in the vertical direction may be provided as the exhaust hole structure.

Figure 12:
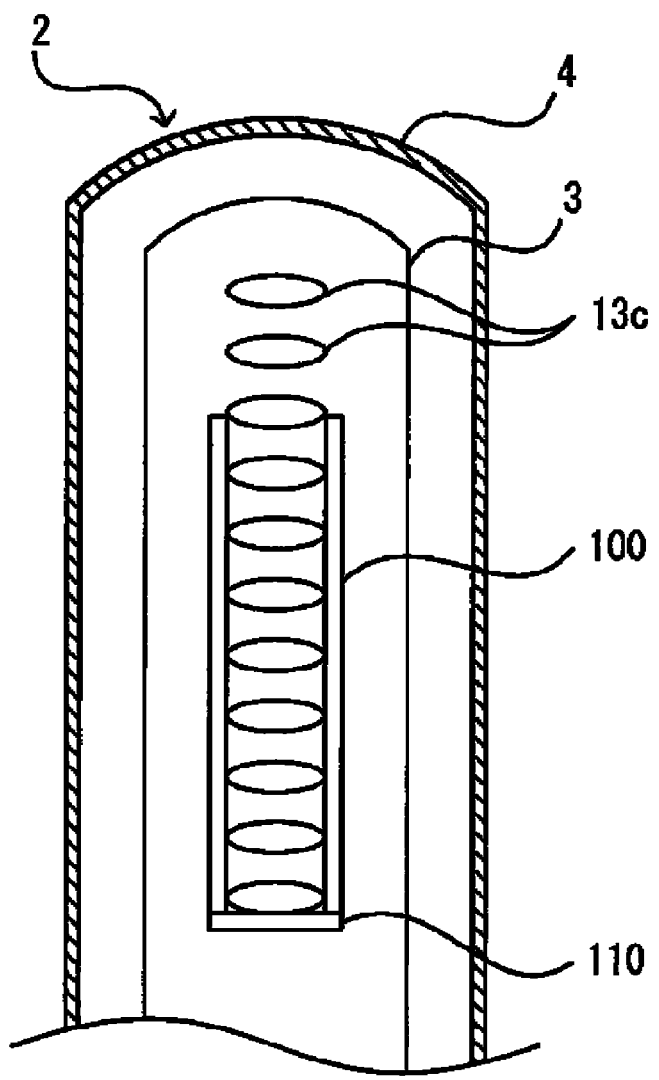
FIG. 12 is a diagram schematically illustrating still another modified example of the exhaust hole structure in the process tube of the substrate processing apparatus preferably used in the embodiments of the present disclosure, wherein a plurality of small elliptical openings elongated in a horizontal direction are arranged in the vertical direction as the exhaust hole structure.

For example, as shown in an exhaust hole structure 13c of FIG. 12, a plurality of small elliptical openings elongated in a horizontal direction may be arranged in the vertical direction as the exhaust hole structure.

Figure 13:
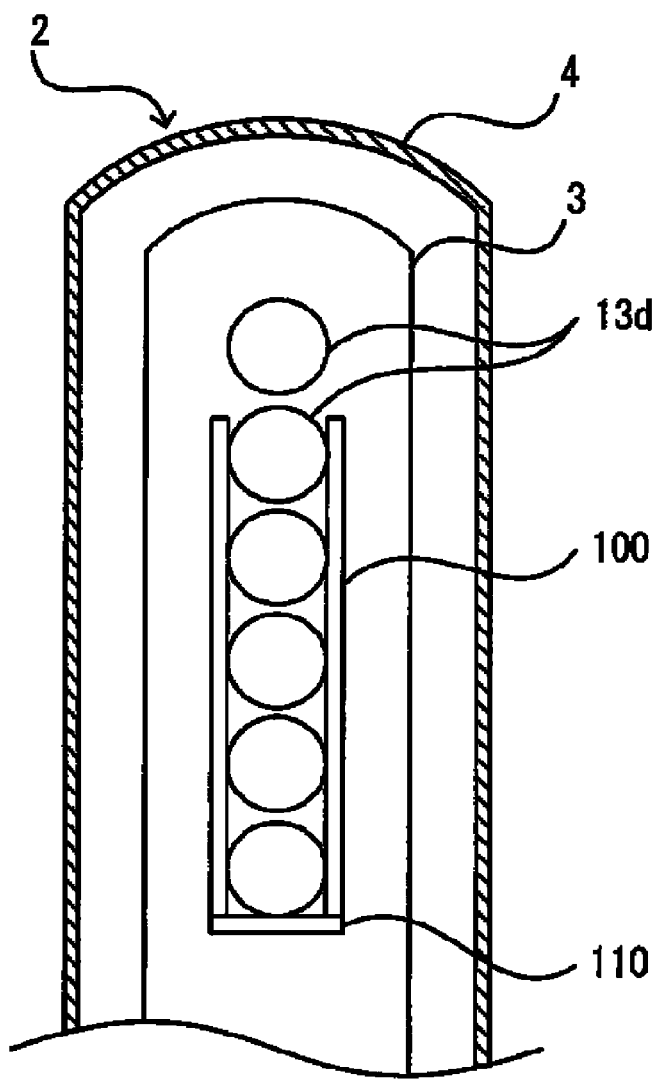
FIG. 13 is a diagram schematically illustrating still another modified example of the exhaust hole structure in the process tube of the substrate processing apparatus preferably used in the embodiments of the present disclosure, wherein a plurality of small circular openings are arranged in the vertical direction as the exhaust hole structure.

For example, as shown in an exhaust hole structure 13d of FIG. 13, a plurality of small circular openings may be arranged in the vertical direction as the exhaust hole structure.

Figure 14:
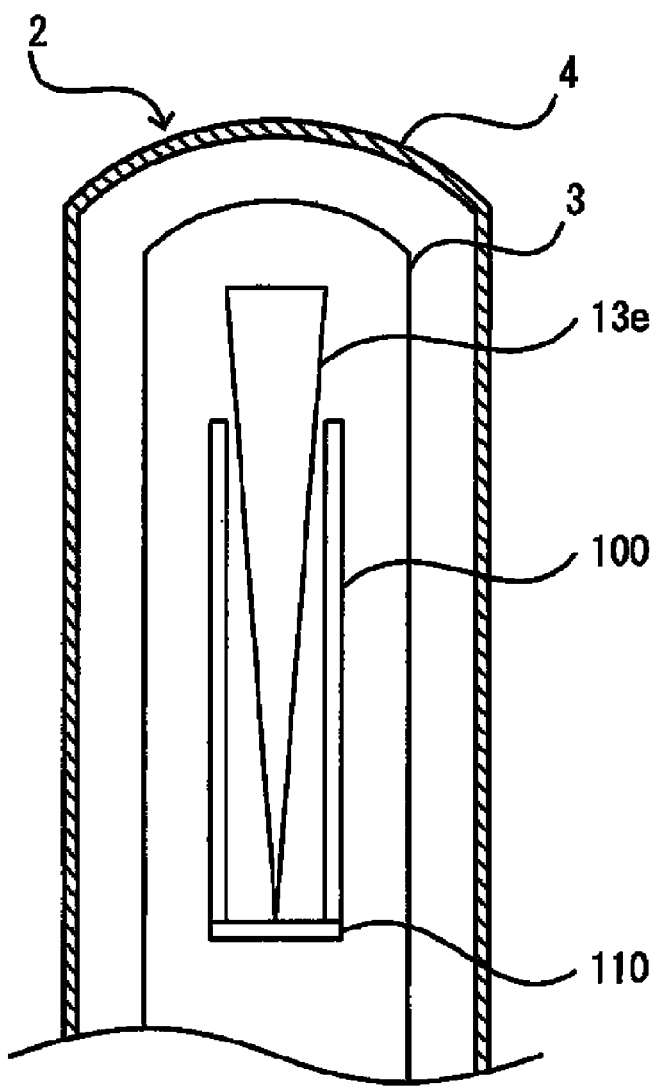
FIG. 14 is a diagram schematically illustrating still another modified example of the exhaust hole structure in the process tube of the substrate processing apparatus preferably used in the embodiments of the present disclosure, wherein a triangular opening extending in the vertical direction is provided as the exhaust hole structure.

For example, as shown in an exhaust hole structure 13e of FIG. 14, a triangular opening extending in the vertical direction may be provided as the exhaust hole structure. For example, the base of the triangle formed by triangular opening may be located at the top thereof, or the base of the triangular opening may be located at the bottom thereof. However, from a viewpoint of uniformizing the flow of the gas discharged from the exhaust hole structure 13e in the vertical direction, it is preferable that the base of the triangle is located farther from the exhaust pipe 12.

Figure 15:
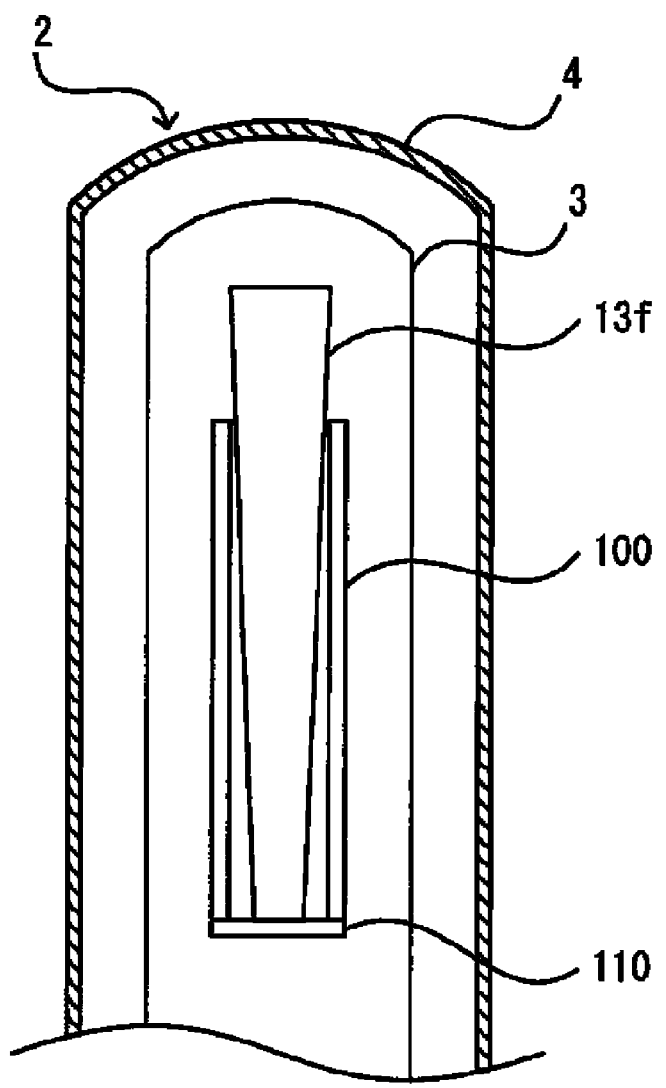
FIG. 15 is a diagram schematically illustrating still another modified example of the exhaust hole structure in the process tube of the substrate processing apparatus preferably used in the embodiments of the present disclosure, wherein a trapezoidal opening extending in the vertical direction is provided as the exhaust hole structure.

For example, as shown in an exhaust hole structure 13f of FIG. 15, a trapezoidal opening extending in the vertical direction may be provided as the exhaust hole structure. For example, the upper base of the trapezoid formed by the trapezoidal opening may be set to be longer than the lower base thereof, or the lower base thereof may be set to be longer than the upper base thereof. However, from a viewpoint of uniformizing the flow of the gas discharged from the exhaust hole structure 13f in the vertical direction, it is preferable that one of the bases of the trapezoid farther from the exhaust pipe 12 (that is, the upper base of the trapezoid in the illustrated example) is set to be longer.

Figure 16:
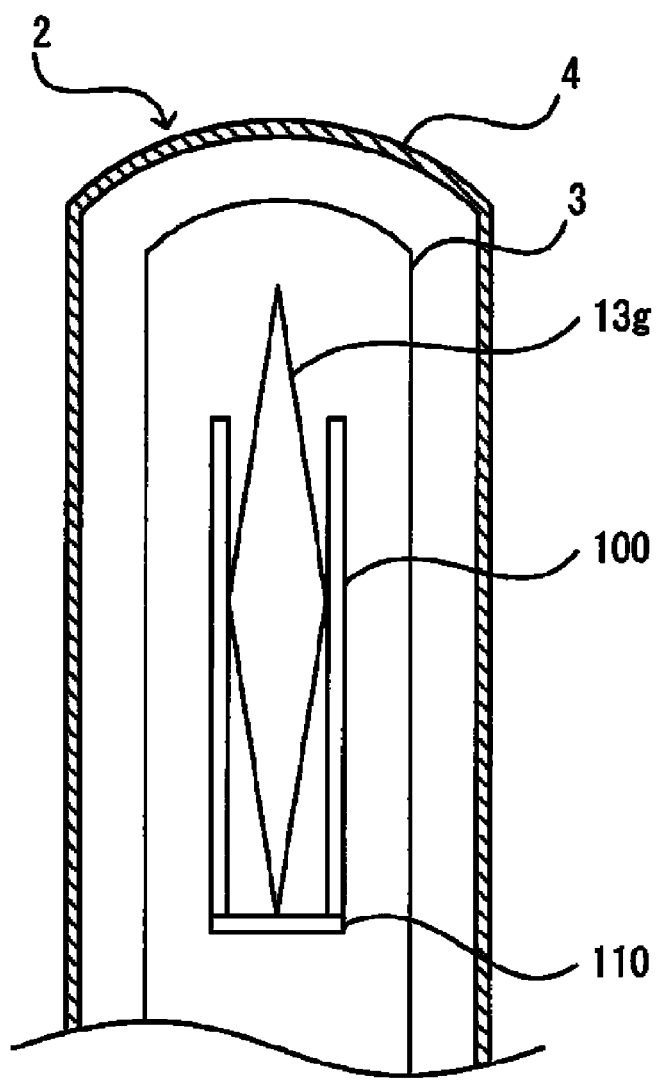
FIG. 16 is a diagram schematically illustrating still another modified example of the exhaust hole structure in the process tube of the substrate processing apparatus preferably used in the embodiments of the present disclosure, wherein a rhombus-shaped opening extending in the vertical direction is provided as the exhaust hole structure.

For example, as shown in an exhaust hole structure 13g of FIG. 16, a rhombus-shaped opening (that is, a diamond-shaped opening) extending in the vertical direction may be provided as the exhaust hole structure.

Figure 17:
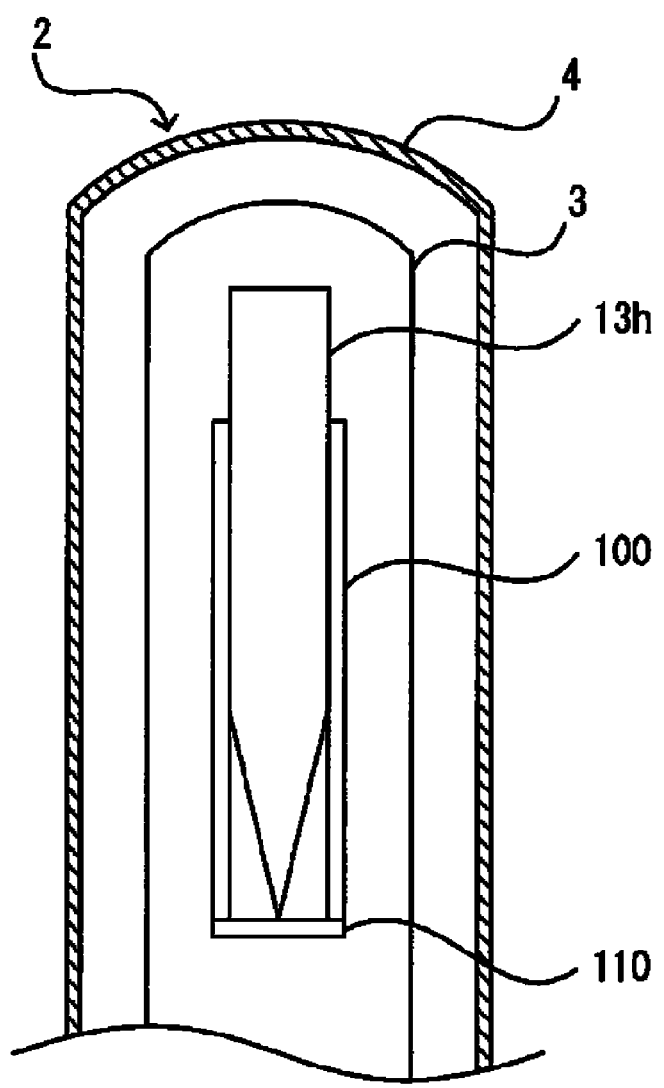
FIG. 17 is a diagram schematically illustrating still another modified example of the exhaust hole structure in the process tube of the substrate processing apparatus preferably used in the embodiments of the present disclosure, wherein a polygonal opening extending in the vertical direction is provided as the exhaust hole structure.

For example, as shown in an exhaust hole structure 13h of FIG. 17, a polygonal opening extending in the vertical direction may be provided as the exhaust hole structure. For example, an opening area of the upper half of the polygonal opening may be set to be greater than an opening area of the lower half of the polygonal opening, or the opening area of the lower half of the polygonal opening may be set to be greater than the opening area of the upper half of the polygonal opening. However, from a viewpoint of uniformizing the flow of the gas discharged from the exhaust hole structure 13h in the vertical direction, it is preferable that the opening area of one of the two halves of the polygon farther from the exhaust pipe 12 (which is the upper half of the polygonal opening in the illustrated example) is set to be greater.

In addition, while the present embodiments are described by way of an example in which the fin 100 of a staircase shape is attached to the inner tube 3, the present embodiments are not limited thereto, and the present embodiments may be modified in various ways without departing from the scope thereof.

Figure 18:
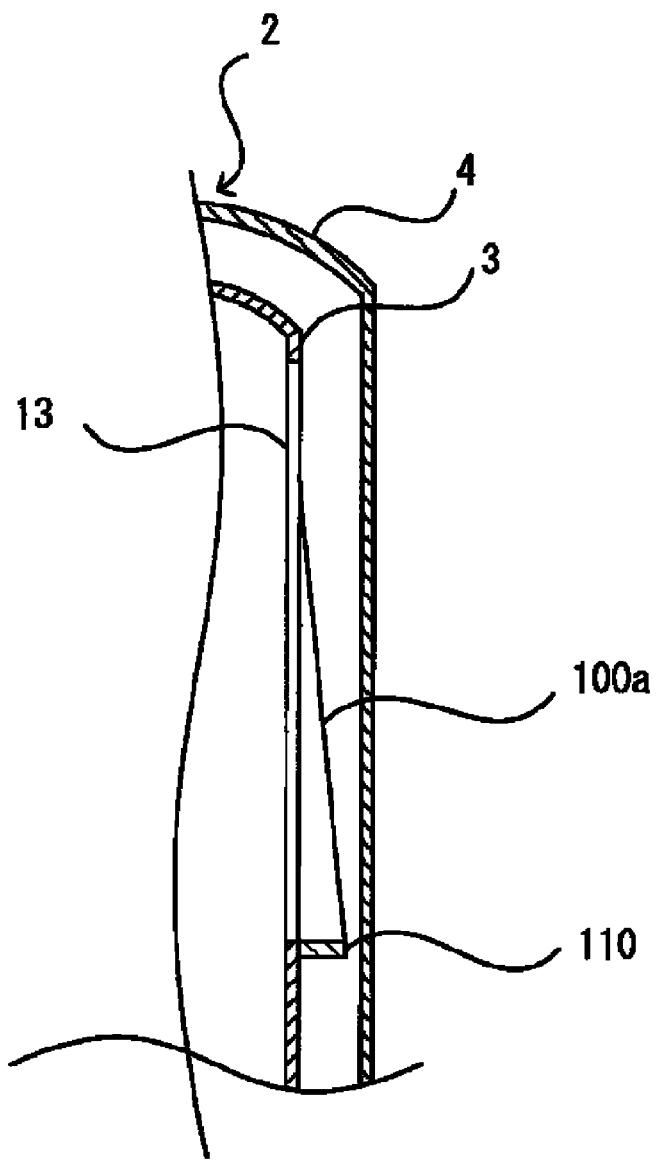
FIG. 18 is a diagram schematically illustrating a modified example of the fin in the process tube of the substrate processing apparatus preferably used in the embodiments of the present disclosure, wherein the fin of a triangular shape is provided.

For example, as shown in FIG. 18, a fin 100a of a triangular shape may be provided.

Figure 19:
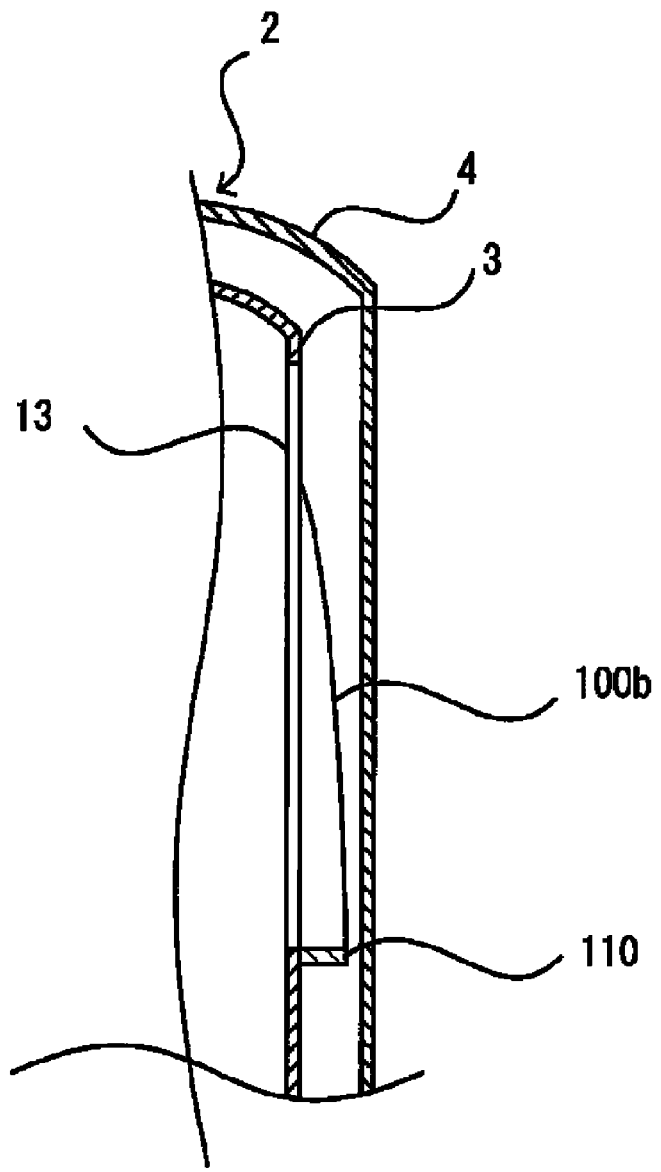
FIG. 19 is a diagram schematically illustrating another modified example of the fin in the process tube of the substrate processing apparatus preferably used in the embodiments of the present disclosure, wherein the fin of a curved shape is provided.

For example, as shown in FIG. 19, a fin 100b of a curved shape may be provided.

Figure 20:
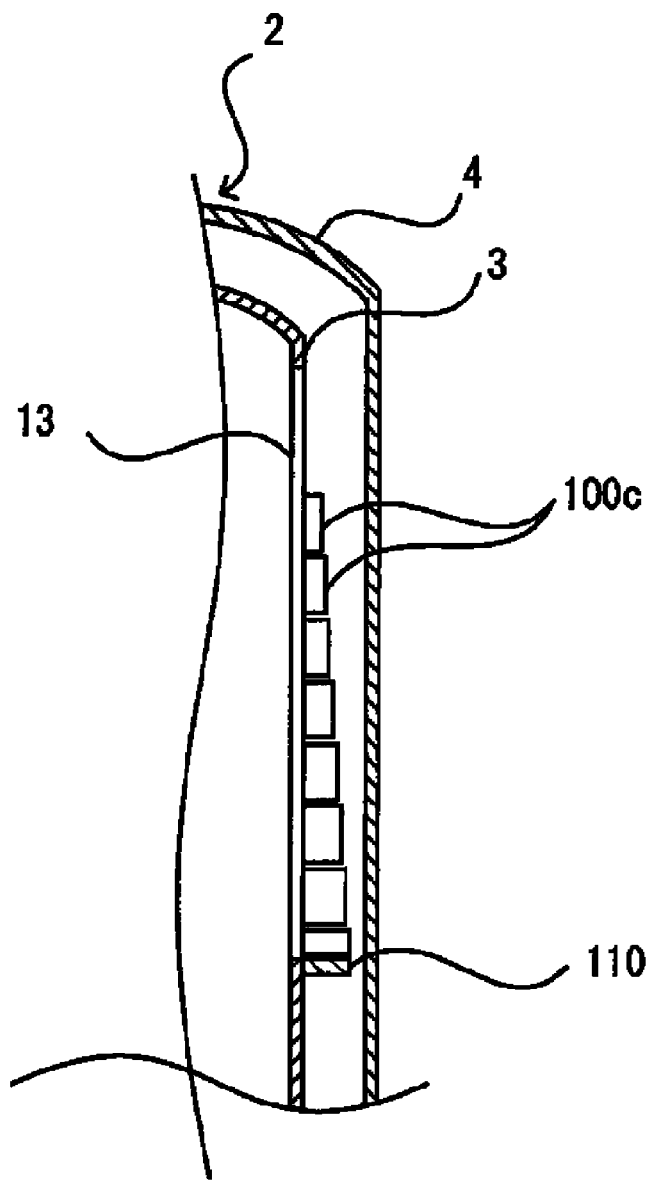
FIG. 20 is a diagram schematically illustrating still another modified example of the fin in the process tube of the substrate processing apparatus preferably used in the embodiments of the present disclosure, wherein the fin of a staircase shape is provided by combining a plurality of small pieces divided in the vertical direction.

For example, as shown in FIG. 20, a fin 100c of a staircase shape (or a triangular shape or a curved shape) may be provided by combining a plurality of small pieces divided in the vertical direction.

Figure 21:
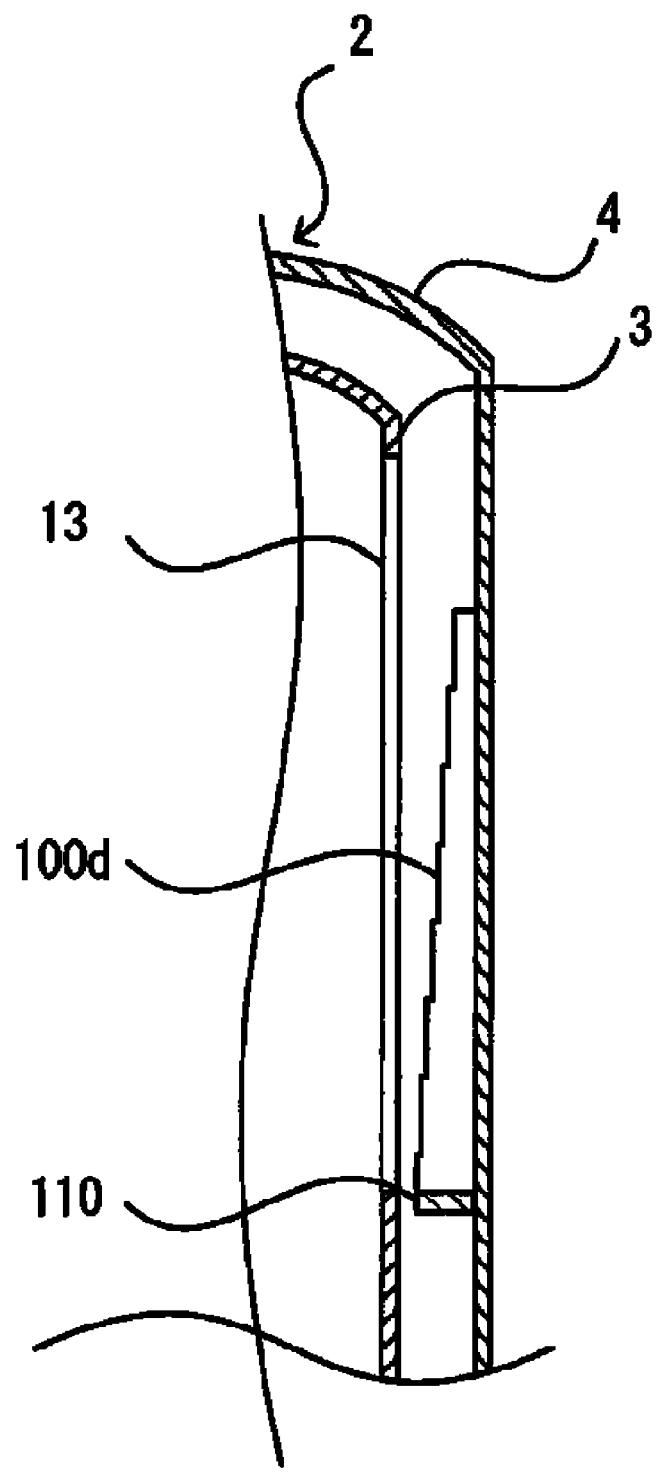
FIG. 21 is a diagram schematically illustrating still another modified example of the fin in the process tube of the substrate processing apparatus preferably used in the embodiments of the present disclosure, wherein the fin is attached to an outer tube of the substrate processing apparatus.

For example, as shown in FIG. 21, a fin 100d may be attached to the outer tube 4.

Figure 22:
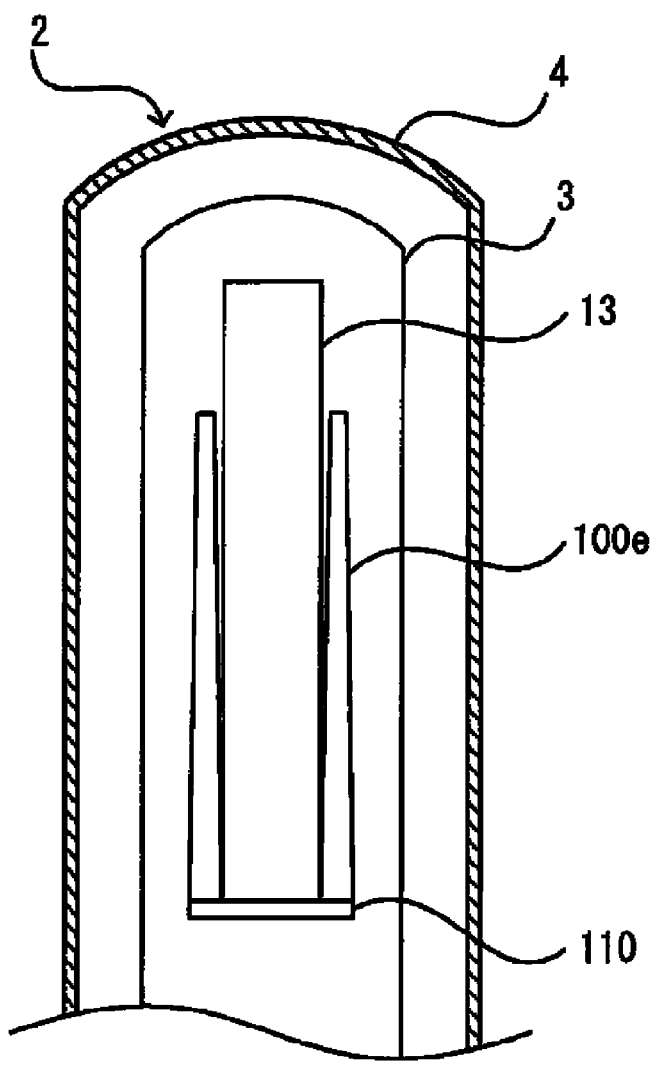
FIG. 22 is a diagram schematically illustrating still another modified example of the fin in the process tube of the substrate processing apparatus preferably used in the embodiments of the present disclosure, wherein a thickness of the fin varies along the vertical direction.

For example, as shown in FIG. 22, it is possible to provide a fin 100e whose thickness varies along the vertical direction. For example, the thickness of the fin 100e at an upper portion of the fin 100e may be set to be greater than the thickness of the fin 100e at a lower portion of the fin 100e, or the thickness of the fin 100e at the lower portion may be set to be greater than the thickness of the fin 100e at the upper portion. However, from a viewpoint of uniformizing the flow of the gas discharged from the exhaust hole structure 13 in the vertical direction, it is preferable that the thickness of the fin 100e at a portion farther from the exhaust pipe 12 (that is, the upper side of the fin 100e) is set to be greater.

Figure 23:
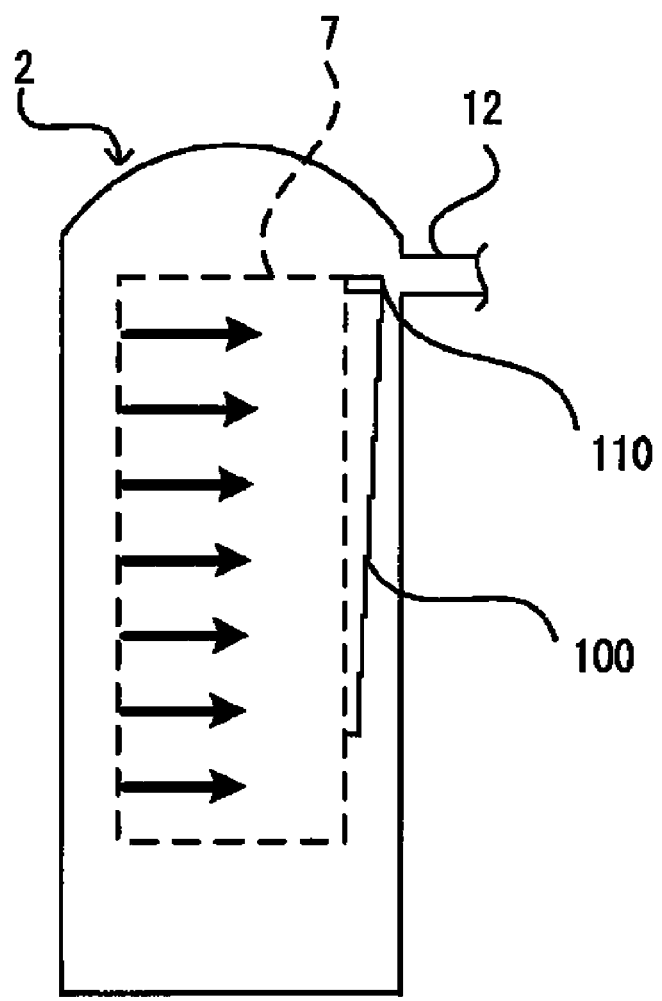
FIG. 23 is a diagram schematically illustrating a modified example of the process tube of the substrate processing apparatus preferably used in the embodiments of the present disclosure, wherein an exhaust pipe is provided at a location near an upper portion of the exhaust hole structure.

In addition, while the present embodiments are described by way of an example in which the process tube 2 is configured such that the gas is exhausted through the exhaust pipe 12 located near the lower portion of the exhaust hole structure 13, the present embodiments are not limited thereto, and the present embodiments may be modified in various ways without departing from the scope thereof. For example, as shown in FIG. 23, the process tube 2 may be configured such that the gas is exhausted through the exhaust pipe 12 located near the upper portion of the exhaust hole structure 13. In such a case, the fin 100 is configured such that the pressure of the gas at the upper portion of the exhaust hole structure 13 is high. That is, an arrangement of the fin 100 is determined according to a positional relationship between the exhaust hole structure 13 and the exhaust pipe 12.

Effects According to Present Embodiments

According to the present embodiments described above, it is possible to provide one or more of the following effects (a) through (n).

(a) According to the present embodiments, the process chamber 7 is provided in the process tube 2 such that the nozzles 34, 35, 36 and 37 serving as the gas supplier are provided in the spare chamber 33 at one end of the process chamber 7 and the exhaust hole structure 13 serving as the discharger is provided at the other end of the process chamber 7, the fin 100 serving as the adjusting structure configured to suppress the flow of the gas discharged (or exhausted) through the exhaust hole structure 13 is provided, and the flow of the gas from the plurality of gas supply holes 38, the plurality of gas supply holes 39, the plurality of gas supply holes 40 and the plurality of gas supply holes 41 to the exhaust hole structure 13 in the process chamber 7 is adjusted by using the fin 100. As described above, by providing the fin 100 in the location where the pressure is lower and the gas flows more easily and by increasing the pressure in the vicinity of the exhaust hole structure 13, it is possible to suppress the flow of the gas so as to make it difficult for the gas to flow in the vicinity of the exhaust hole structure 13. Thereby, it is possible to uniformize the flow of the gas in the entirety of the exhaust hole structure 13. As a result, it is possible to reduce the pressure difference in the arrangement region of the wafers 6 of the process chamber 7. Therefore, it is possible to uniformly supply the gas to each of the wafers 6, and it is also possible to uniformize the thickness of the film formed on each of the wafers 6.

(b) According to the present embodiments, the fins 100 are provided at both sides of the exhaust hole structure 13. As a result, the pressure in the vicinity of the exhaust hole structure 13 can be effectively increased, thereby suppressing the flow of the gas so as to make it difficult for the gas to flow in the vicinity of the exhaust hole structure 13. Therefore, it is possible to uniformize the flow of the gas in the entirety of the exhaust hole structure 13, and it is also possible to reduce the pressure difference in the arrangement region of the wafers 6 of the process chamber 7.

(c) According to the present embodiments, the fin 100 is provided at the lower portion of the exhaust hole structure 13. When the exhaust pipe 12 is located near the lower portion of the exhaust hole structure 13, by providing the fin 100 at the lower portion of the exhaust hole structure 13, it is possible to increase the pressure at the location where the gas easily flows. Thereby, it is possible to uniformize the flow of the gas at the upper portion and the lower portion of the exhaust hole structure 13. In addition, it is also possible to reduce the pressure difference between the upper portion and the lower portion of the arrangement region of the wafers 6 of the process chamber 7.

(d) According to the present embodiments, the thickness of the fin 100e varies along the vertical direction of the exhaust hole structure 13. With such a configuration, it is possible to increase the pressure at the location where the gas easily flows. Thereby, it is possible to uniformize the flow of the gas at the upper portion and the lower portion of the exhaust hole structure 13. In addition, it is also possible to reduce the pressure difference between the upper portion and the lower portion of the arrangement region of the wafers 6 of the process chamber 7.

(e) According to the present embodiments, the fin such as the fin 100 of a staircase shape and the fin 100a of a triangular shape is provided. With such a configuration, it is possible to increase the pressure at the location where the gas easily flows. Thereby, it is possible to uniformize the flow of the gas at the upper portion and the lower portion of the exhaust hole structure 13. In addition, it is also possible to reduce the pressure difference between the upper portion and the lower portion of the arrangement region of the wafers 6 of the process chamber 7.

(f) According to the present embodiments, at least a part of the exhaust hole structure 13 is provided without the fin 100. With such a configuration, it is possible to increase the pressure at the location where the gas easily flows. Thereby, it is possible to uniformize the flow of the gas at the upper portion and the lower portion of the exhaust hole structure 13. In addition, it is also possible to reduce the pressure difference between the upper portion and the lower portion of the arrangement region of the wafers 6 of the process chamber 7.

(g) According to the present embodiments, the fin 100 is configured to suppress the flow of a part of the gas discharged from the exhaust hole structure 13. With such a configuration, it is possible to increase the pressure at the location where the gas easily flows. Thereby, it is possible to uniformize the flow of the gas at the upper portion and the lower portion of the exhaust hole structure 13. In addition, it is also possible to reduce the pressure difference between the upper portion and the lower portion of the arrangement region of the wafers 6 of the process chamber 7.

(h) According to the present embodiments, the fin 100 is configured to uniformize the flow velocity of the gas discharged from the exhaust hole structure 13. With such a configuration, it is possible to uniformize the flow of the gas discharged from the exhaust hole structure 13 in the vertical direction. As a result, it is possible to uniformly supply the gas to each of the wafers 6, and it is also possible to uniformize the thickness of the film formed on each of the wafers 6.

(i) According to the present embodiments, the fin 100 is configured to uniformize the pressure of the gas at the exhaust hole structure 13. With such a configuration, it is possible to uniformize the flow of the gas discharged from the exhaust hole structure 13 in the vertical direction. As a result, it is possible to uniformly supply the gas to each of the wafers 6, and it is also possible to uniformize the thickness of the film formed on each of the wafers 6.

(j) According to the present embodiment, the exhaust hole structure is selected from the group consisting of the quadrangular opening (that is, the exhaust hole structure 13), the triangular opening (that is, the exhaust hole structure 13e), the trapezoidal opening (that is, the exhaust hole structure 13f), the rhombus-shaped opening (that is, the exhaust hole structure 13g), the polygonal opening (that is, the exhaust hole structure 13h) and the elliptical opening (that is, the exhaust hole structure 13b). Thereby, it is possible to increase the pressure at the location where the gas easily flows by appropriately combining two or more configurations of the fin 100. Accordingly, it is possible to uniformize the flow of the gas at the upper portion and the lower portion of the exhaust hole structure 13. In addition, it is also possible to reduce the pressure difference between the upper portion and the lower portion of the arrangement region of the wafers 6 of the process chamber 7.

(k) According to the present embodiment, the exhaust pipe 12 through which the gas discharged from the exhaust hole structure 13 is exhausted out of the process tube 2 is further provided, and the arrangement of the fin 100 is determined according to the positional relationship between the exhaust hole structure 13 and the exhaust pipe 12. With such a configuration, it is possible to uniformize the flow of the gas discharged from the exhaust hole structure 13 in the vertical direction. As a result, it is possible to uniformly supply the gas to each of the wafers 6, and it is also possible to uniformize the thickness of the film formed on each of the wafers 6.

(l) According to the present embodiment, the thickness of the fin 100e decreases as it goes upward. When the exhaust pipe 12 is located near the lower portion of the exhaust hole structure 13, by providing the fin 100e whose thickness decreases as it goes upward (that is, the fin 100e whose thickness increases as it goes downward), it is possible to increase the pressure at the location where the gas easily flows. Thereby, it is possible to uniformize the flow of the gas at the upper portion and the lower portion of the exhaust hole structure 13. In addition, it is also possible to reduce the pressure difference between the upper portion and the lower portion of the arrangement region of the wafers 6 of the process chamber 7.

(m) According to the present embodiment, the process tube 2 includes the inner tube 3 in which the process chamber 7 is provided and the outer tube 4 provided outside of the inner tube 3 in a manner concentric with the inner tube 3, the fin 100 is provided in the space between the inner tube 3 and the outer tube 4, and the spatial ratio (Wf/Ws) of the width Wf of the fin 100 to the width Ws of the space provided between the inner tube 3 and the outer tube 4 is set to be within a range from 0.2 to 0.9 in the entire region of the fin 100 along the vertical direction. When the spatial ratio (Wf/Ws) is less than 0.2, the pressure of the gas discharged from the exhaust hole structure 13 cannot be effectively increased. When the spatial ratio (Wf/Ws) is greater than 0.9, the pressure of the gas discharged from the exhaust hole structure 13 may be increased excessively. In both cases described above, it becomes difficult to uniformize the flow of the gas in the upper portion and the lower portion of the exhaust hole structure 13. Therefore, by setting the spatial ratio within a range from 0.2 to 0.9, it is possible to easily uniformize the flow of the gas at the upper portion and the lower portion of the exhaust hole structure 13. In addition, it is also possible to reduce the pressure difference between the upper portion and the lower portion of the arrangement region of the wafers 6 of the process chamber 7.

(n) According to the present embodiment, the process tube 2 includes the inner tube 3 in which the process chamber 7 is provided and the outer tube 4 provided outside of the inner tube 3 in a manner concentric with the inner tube 3, and the pedestal 110 supporting the fin 100 in the vicinity of the exhaust hole structure 13 provided at the inner tube 3. By adjusting the pressure of the gas discharged from the exhaust hole structure 13 by combining two or more configurations of the fin 100 and the pedestal 110 as described above, it is possible to easily uniformize the flow of the gas at the upper portion and the lower portion of the exhaust hole structure 13. In addition, it is also possible to reduce the pressure difference between the upper portion and the lower portion of the arrangement region of the wafers 6 of the process chamber 7.

Other Embodiments

While the technique of the present disclosure is described in detail by way of the embodiments described above, the above-described technique is not limited thereto. The above-described technique may be modified in various ways without departing from the scope thereof.

For example, the substrate processing apparatus according to the embodiments described above can be applied not only to the semiconductor manufacturing apparatus capable of manufacturing the semiconductor device but also to other substrate processing apparatuses such as an LCD (liquid crystal display) manufacturing apparatus capable of processing a glass substrate. In addition, for example, the substrate processing according to the embodiments described above may include a process such as a CVD (Chemical Vapor Deposition) process, a PVD (Physical Vapor Deposition) process, a process of forming an oxide film, a process of forming a nitride film, a process of forming a film containing a metal, an annealing process, an oxidation process, a nitriding process and a diffusion process. In addition, the technique of the present disclosure may also be applied to other substrate processing apparatuses such as an exposure apparatus, a coating apparatus, a drying apparatus and a heating apparatus.

According to some embodiments of the present disclosure, it is possible to uniformize the flow of the gas discharged from the discharger by reducing the pressure difference in the substrate arrangement region of the process chamber.

What is claimed is:

1. A reaction tube, comprising:
   a discharger from which a gas in a process chamber is discharged; and
   an adjusting structure protruding outward from the process chamber with at least a width of the discharger along a left-right direction so as to suppress a flow of the gas discharged from the discharger,
   wherein a protruding length of the adjusting structure from the process chamber varies along a vertical direction, and
   wherein a thickness of the adjusting structure protruding outward from the process chamber is decreased along an upward direction of the discharger.

2. The reaction tube of claim 1, wherein the adjusting structure is configured to suppress a flow of a part of the gas discharged from the discharger.

3. The reaction tube of claim 2, wherein the adjusting structure is further configured to uniformize the flow of the gas discharged from the discharger such that the flow of the gas is uniformized along the vertical direction.

4. The reaction tube of claim 1, wherein the adjusting structure is provided at both sides of the discharger.

5. The reaction tube of claim 1, wherein the adjusting structure is provided below the discharger.

6. The reaction tube of claim 1, wherein the thickness of the adjusting structure protruding outward from the process chamber varies along a vertical direction of the discharger.

7. The reaction tube of claim 6, wherein the adjusting structure is of a staircase shape or a triangular shape.

8. The reaction tube of claim 7, wherein the adjusting structure is configured to uniformize a pressure of the gas at the discharger.

9. The reaction tube of claim 1, wherein at least a part of the discharger is provided without the adjusting structure.

10. The reaction tube of claim 1, wherein a shape of the discharger is selected from the group consisting of a quadrangular shape, a triangular shape, a trapezoidal shape, a rhombus shape, a polygonal shape and an elliptical shape.

11. A method of manufacturing a semiconductor device, comprising:
   (a) loading a substrate into the reaction tube of claim 1; and
   (b) processing the substrate.

12. A substrate processing apparatus comprising
   a reaction tube comprising:
      a discharger from which a gas in a process chamber is discharged; and
      an adjusting structure protruding outward from the process chamber with at least a width of the discharger along a left-right direction so as to suppress a flow of the gas discharged from the discharger,
      wherein a protruding length of the adjusting structure from the process chamber varies along a vertical direction, and
      wherein a thickness of the adjusting structure protruding outward from the process chamber is decreased along an upward direction of the discharger.

13. The substrate processing apparatus of claim 12, further comprising
   an exhaust pipe through which the gas discharged from the discharger is exhausted out of the reaction tube,
   wherein an arrangement of the adjusting structure is determined according to a positional relationship between the discharger and the exhaust pipe.

14. The substrate processing apparatus of claim 12, wherein the thickness of the adjusting structure protruding outward from the process chamber varies along a vertical direction of the discharger.

15. The substrate processing apparatus of claim 12, wherein the adjusting structure is provided at both sides of the discharger.

16. The substrate processing apparatus of claim 12, wherein the adjusting structure is of a staircase shape or a triangular shape.

17. The substrate processing apparatus of claim 12, wherein the reaction tube further comprises:
   an inner tube in which the process chamber is provided; and
   an outer tube provided outside of the inner tube in a manner concentric with the inner tube,
   wherein the adjusting structure is installed in a space provided between the inner tube and the outer tube.

18. The substrate processing apparatus of claim 12, wherein at least a part of the discharger is provided without the adjusting structure.

19. The substrate processing apparatus of claim 12, wherein the reaction tube further comprises a pedestal disposed in vicinity of the discharger.

* * * * *